United States Patent
Nagai

(10) Patent No.: US 7,872,280 B2
(45) Date of Patent: Jan. 18, 2011

(54) SEMICONDUCTOR LIGHT EMITTING DEVICE, METHOD OF MANUFACTURING THE SAME, AND LIGHTING APPARATUS AND DISPLAY APPARATUS USING THE SAME

(75) Inventor: Hideo Nagai, Takatsuki (JP)

(73) Assignee: Panasonic Corporation, Osaka (JP)

( * ) Notice: Subject to any disclaimer, the term of this patent is extended or adjusted under 35 U.S.C. 154(b) by 243 days.

(21) Appl. No.: 12/361,396

(22) Filed: Jan. 28, 2009

(65) Prior Publication Data

US 2009/0134425 A1    May 28, 2009

Related U.S. Application Data

(62) Division of application No. 10/563,268, filed as application No. PCT/JP2004/010244 on Jul. 12, 2004, now Pat. No. 7,683,377.

(30) Foreign Application Priority Data

Jul. 16, 2003    (JP)    ............... 2003-275454

(51) Int. Cl.
  *H01L 33/00*    (2010.01)
(52) U.S. Cl. ................ 257/99; 257/686; 257/777
(58) Field of Classification Search .......... 257/99, 257/686, 777
  See application file for complete search history.

(56) References Cited

U.S. PATENT DOCUMENTS 5,162,878 A    11/1992    Sasagawa et al.
6,410,348 B1    6/2002    Chen et al.
6,495,862 B1    12/2002    Okazaki et al.
2001/0010449 A1    8/2001    Chiu et al.
2004/0001239 A1    1/2004    Brukilacchio et al.

FOREIGN PATENT DOCUMENTS

| EP | 0 361 602 | 9/1989 |
| EP | 0 404 565 A1 | 6/1990 |
| JP | 2836687 | 10/1998 |
| JP | 2000-077713 | 3/2000 |
| JP | 2001-177158 | 6/2001 |
| JP | 2003-46124 | 2/2003 |
| JP | 2004-134633 | 4/2004 |

OTHER PUBLICATIONS

Illek, Stefan et al.; Buried Micro-Reflectors Boost Performance of AlGaInP LEDs; Compound Semiconductor; Jan./Feb. 2002; pp. 39-42.

*Primary Examiner*—Long Pham

(57) ABSTRACT

The present invention aims to provide a semiconductor light emitting device that may be firmly attached to a substrate with maintaining excellent light emitting efficiency, and a manufacturing method of the same, and a lighting apparatus and a display apparatus using the same.

In order to achieve the above object, the semiconductor light emitting device according to the present invention includes a luminous layer, a light transmission layer disposed over a main surface of the luminous layer, and having depressions on a surface facing away from the luminous layer, and a transmission membrane disposed on the light transmission layer so as to follow contours of the depressions, and light from the luminous layer is irradiated so as to pass through the light transmission layer and the transmission membrane.

7 Claims, 20 Drawing Sheets

SEMICONDUCTOR LIGHT EMITTING DEVICE, METHOD OF MANUFACTURING THE SAME, AND LIGHTING APPARATUS AND DISPLAY APPARATUS USING THE SAME

RELATED APPLICATIONS

The present application is a divisional application from U.S. patent application Ser. No. 10/563,268 filed on Jan. 4, 2006.

TECHNICAL FIELD

The present invention relates to a semiconductor light emitting device and a method of manufacturing the same, as well as a lighting apparatus and a display apparatus using the same.

BACKGROUND ART

Lighting apparatuses with light emitting diodes (LEDs) have been gaining attention as a new light source because of excellent properties in terms of light emitting efficiency and longevity in comparison with incandescent lamps or halogen lamps. In order to improve light output of this kind of lighting apparatus, a quick solution is to mount LEDs in high density. However, this solution is not very realistic due to current issues regarding production cost and heat dissipation in driving when LEDs are mounted in high density. A more realistic solution in order to enhance the light output is to make luminous efficiency of an LED as high as possible. Various attempts have been made to this end, and two key parameters in making such attempts are Internal Quantum Efficiency (IQE) and External Quantum Efficiency (EQE).

The IQE is a parameter indicating the amount of light generated in a luminous layer of an LED to the amount of electric power that is supplied to the LED. The IQE is affected by the crystallinity of a semiconductor and the structure of the luminous layer that constitute the LED.

On the other hand, the EQE is a parameter indicating an amount of light emitted outside the LED to the amount of supplied electric power, and expressed by a product of the IQE and light extraction efficiency (a proportion of the amount of light emitted outside the LED in the amount of light generated in the LED). The light extraction efficiency is affected by the shape of a bare chip, the material that covers the bare chip, and the shape of the material. In order to improve the light extraction efficiency, it is common to cover a bare chip with resin so as to minimize the refractive index difference at a boundary between the bare chip and outside of the bare chip as much as possible.

Moreover, in a case of lighting apparatuses using LEDs, it is common for a light extracting surface of a bare chip to have depressions so that an incident angle of light on the light extracting surface is not fixed to one angle, thus improving the light extraction efficiency (Japanese Patent No. 2836687, and *Compound Semiconductor*, Vol. 8, No. 1, pp. 39-42, 2002).

As a method of mounting a bare chip on a mounting substrate, flip-chip bonding as shown in FIG. 20 is commonly employed. In the flip-chip bonding as illustrated in FIG. 20, a vacuum collet 1300 sticks to a light extracting surface of a bare chip 1100, and the bare chip 1100 is joined with a wiring layer 1210 of a mounting substrate 1200 using ultrasonic bonding. By mounting the bare chip 1100 in this way, the distance between a light emitting layer of the bare chip 1100 and the mounting substrate 1200 is shortened, thus making it possible to effectively dissipate the heat generated in the light emitting layer. In other words, the flip-chip bonding is very effective for a lighting apparatus that requires LEDs in high density, in order to ensure a high heat dissipation capacity.

However, mounting bare chips having depressions on the light extracting surface using the flip-chip bonding often causes problems such as decreases in positioning accuracy and bonding strength, and destruction of the depressions. Specifically, as shown in an enlarged view in the circle in FIG. 20, depressions 1111 make it difficult for the vacuum collet 1300 to stick to the bare chip 1100 without fail, and for ultrasonic waves to propagate from the vacuum collet 1300 to the bare chips 1100 sufficiently for bonding. The same kind of problems also occur in display apparatuses having bare chips.

DISCLOSURE OF THE INVENTION

In order to solve the above noted problems, the present invention aims to provide a semiconductor light emitting device that may be firmly attached to a substrate with maintaining excellent light emitting efficiency, and a manufacturing method of the same, and a lighting apparatus and a display apparatus using the same.

In order to achieve the above object, a semiconductor light emitting device having a luminous layer according to the present invention comprises a light transmission layer disposed over a main surface of the luminous layer, and having depressions on a surface facing away from the luminous layer, and a transmission membrane disposed on the light transmission layer so as to follow contours of the depressions, and light from the luminous layer is irradiated so as to pass through the light transmission layer and the transmission membrane.

The above semiconductor light emitting device has the depressions on a surface of the light transmission layer facing away from the luminous layer. Accordingly, the light emitted from the luminous layer is scattered by the depressions or transmitted efficiently, and thus high light extraction efficiency is maintained, as well as high light emission efficiency. Further, the depressions of the semiconductor light emitting device according to the present invention are filled and covered by the membrane, and therefore it is possible to suppress destruction of the depressions by ultrasonic waves applied when the bare chip is mounted to a mounting substrate. Because of this, with the semiconductor light emitting device according to the present invention, it is possible to obtain high light emission efficiency.

Moreover, with the semiconductor light emitting device according to the present invention, a loss of ultrasonic energy is not large because of the above membrane, even when the chip is mounted to the mounting substrate.

Accordingly, the semiconductor light emitting device according to the present invention has an advantage to be able to firmly attach to the mounting substrate while maintaining a high emission efficiency.

Note that it is possible to mount the chip to the mounting substrate using flip-chip bonding.

The membrane covers the surface so as to follow the contours of the depressions, without including air or gap. Further, by saying the light transmission layer is disposed over the main surface of the luminous layer, it indicates that the light transmission layer may be disposed either directly on the main surface of the luminous layer, or indirectly above the main surface of the luminous layer.

Further, a semiconductor light emitting device usually has a structure that plural layers are formed on the substrate. The above depressions do not necessarily have to be on a surface of a layer out of the plural layers. For example, the depressions may be formed on one of the main surface of the substrate in a case of the semiconductor light emitting device that irradiate light from the luminous layer through the substrate.

When formed irregularly, the depressions serve a function of light diffusion. When the depressions are at a regular interval, a structure of such depressions is called a photonic crystal (PC) or a photonic band gap (PBG) structure, depending on how the depressions are formed. The PC and PBG structures, in general, are a cyclic structure in which depressions and projections appear cyclically at a micron to $\lambda/4$ ($\lambda$ is a wavelength in the medium) order on a surface, and have a characteristic that light having a specific wavelength is selectively reflected and transmitted. Therefore, when the semiconductor light emitting device according to the present invention has the light transmission layer having the depression in either the PC or PBG structure, it is possible to realize a function of allowing the light to be transmitted easily in the light transmission layer.

The above semiconductor light emitting device may be such that the membrane is formed so as to follow the contours of the depressions on the surface of the light transmission layer. However, it is more desirable that the surface of the membrane facing away from the light transmission layer is substantially flat. Specifically, when mounting the above semiconductor light emitting device to a mounting substrate, the vacuum collet sticks to a surface, from which the light is irradiated, of the device, as described above. If the surface to which the vacuum collet sticks is substantially flat, it is possible that the vacuum collet sticks more firmly. Therefore, it is possible to mount the above semiconductor light emitting device to the mounting substrate more accurately.

A main component of the membrane in the above semiconductor light emitting device may be one of polyimide, epoxy, silicone, and glass. When the glass is used as a material of the membrane, it is possible to use glass by the sol-gel method or low-melting glass. Specific examples of the glass material include (1) a glass material using metal alkoxide (such as tetramethoxysilane and tetraethoxysilane) as starting material, (2) a glass material made from polymer ceramic precursor such as perhydropolysilazane, and (3) a glass material made from such as phosphorus oxide and boronic oxide.

With any of the above listed glass materials, it is possible to form a glass layer (membrane) whose upper surface is substantially flat and filling the depressions, by applying the glass material on the depressions using such as potting and spin-coating, drying the glass material, and baking the glass material at a temperature of several hundred degrees centigrade.

It is also desirable that the membrane contains a luminous substance that is excited by the light from the luminous layer. It is especially desirable for a lighting apparatus using the semiconductor light emitting device according to the present invention, if the luminous substance contained in the membrane is a material that is able to convert the light from the luminous layer into the white light (such as a phosphor material).

In order to maintain high light extracting efficiency for the above semiconductor light emitting device, it is also desirable that the depressions on the surface of the light transmission layer are at an interval equal to or greater than $\lambda/4$, $\lambda$ being a wavelength of the light from the luminous layer.

The luminous layer of the semiconductor light emitting device is generally disposed over a transmission substrate in a state being sandwiched between plural layers such as clad layers, contact layers, and buffer layers. The present invention may also be such that the light transmission substrate as a part or all of the light transmission layer has the depressions on one of main surfaces. It is desirable that the light transmission substrate is made of a material having a refractive index that is substantially equal to a refractive index of the luminous layer, because it is effective to maintain high light extraction efficiency. Specifically, the material for the light transmission substrate may be selected from a group of GaN, SiC, and AlN.

The above structure that is characteristics to the present invention may be applied to a light emitting diode device, as well as a Vertical Cavity Surface Emitting Laser device, a Resonant Cavity Light Emitting Diode device, and a Surface Mount Device.

Further, a method of manufacturing the semiconductor light emitting device according to the present invention comprises steps of forming a light transmission layer over a multi-layered body in which the luminous layer is sandwiched between a plurality of layers, the light transmission layer having depressions on a surface facing away from the luminous layer, and forming a transmission membrane on the light transmission layer so as to follow contours of the depressions.

With the above method of manufacturing the semiconductor light emitting device according to the present invention, it is possible to obtain a semiconductor light emitting device having high light extraction efficiency, because the depressions is formed on the surface of the light transmission layer facing away from the luminous layer. Further, the transmission membrane is formed on the light transmission layer so as to fill the depressions, and therefore it is possible to mount the chip firmly with protecting the depressions from destruction when the chip is mounted to the mounting substrate. Specifically, with the above manufacturing method, it is possible to increase the accuracy in mounting when the vacuum collet sticks to the chip, and to reduce a loss of ultrasonic energy in the depressions when the ultrasonic waves are applied.

Accordingly, with the above described method of manufacturing the semiconductor light emitting device according to the present invention, a semiconductor light emitting device that has high light emitting efficiency and may be attached to the substrate firmly may be obtained.

As described in the above, the depressions may serve different functions according to a state of the depressions. When formed irregularly, the depressions serve a function of light diffusion. When the depressions are formed regularly at a fixed interval, a structure of such depressions is called a photonic crystal (PC) or a photonic band gap (PBG) structure.

In the method of manufacturing the semiconductor light emitting device according to the present invention, it is also desirable that the membrane contains a luminous substance that is excited by the light from the luminous layer. It is especially desirable that the membrane is polished to a preferred thickness so that the device may irradiate the white light having a desirable wavelength.

Further, a lighting apparatus according to the present invention is such that the semiconductor light emitting device according to the present invention is mounted to the mounting substrate.

The above lighting apparatus has the semiconductor light emitting device including the light transmission layer having the depressions on the surface and the membrane that covers the light transmission layer, and therefore it is possible to maintain high light emitting efficiency and to firmly attach the semiconductor light emitting device to the mounting substrate.

Therefore, the lighting apparatus according to the present invention has high light emitting efficiency and stable quality.

As described above, the semiconductor light emitting device according to the present invention has the light transmission layer having a surface with the depressions is disposed over the luminous layer. Thus, it is possible to maintain high light extracting efficiency as well as high light emitting efficiency. Further, because the membrane is disposed over the surface so as to fill the depressions, it is possible to realize firm attachment without destroying the depressions when the semiconductor light emitting device is mounted to the mounting substrate.

Further, with the method of manufacturing the semiconductor light emitting device according to the present invention, the light transmission layer having a surface with depressions is formed over the luminous layer on a side that the device irradiate the light, and then the membrane is formed so as to follow the contours of the depressions. Therefore, it is possible to manufacture the semiconductor light emitting device having the above described advantages easily.

In addition, the lighting apparatus according to the present invention has high light emitting efficiency and stable quality, because the above explained semiconductor light emitting device is mounted to the mounting substrate.

A main component of the membrane in the above semiconductor light emitting device membrane may be one of polyimide, epoxy, silicone, glass by the sol-gel method, and low-melting glass. Specific examples of the glass material include (1) a glass material using metal alkoxide (such as tetramethoxysilane and tetraethoxysilane) as starting material, (2) a glass material made from polymer ceramic precursor such as perhydropolysilazane, and (3) a glass material made from such as phosphorus oxide and boronic oxide.

With any of the above listed glass materials, it is possible to form a glass layer (membrane) whose upper surface is substantially flat and filling the depressions, by applying the glass material on the depressions using such as potting and spin-coating, drying the glass material, and baking the glass material at a temperature of several hundred degrees centigrade.

BRIEF DESCRIPTION OF THE DRAWINGS

FIG. 7B is a layout drawing of pads on a LED chip mount unit 1a.

BEST MODE FOR CARRYING OUT THE INVENTION

The following describes preferred embodiments of the present invention with reference to the drawings.

First Embodiment

In a first embodiment, an LED bare chip (hereinafter referred to as the LED chip) 1 is used as an example of semiconductor light emitting devices.

[Structure of LED Chip 1]

Figure 1:
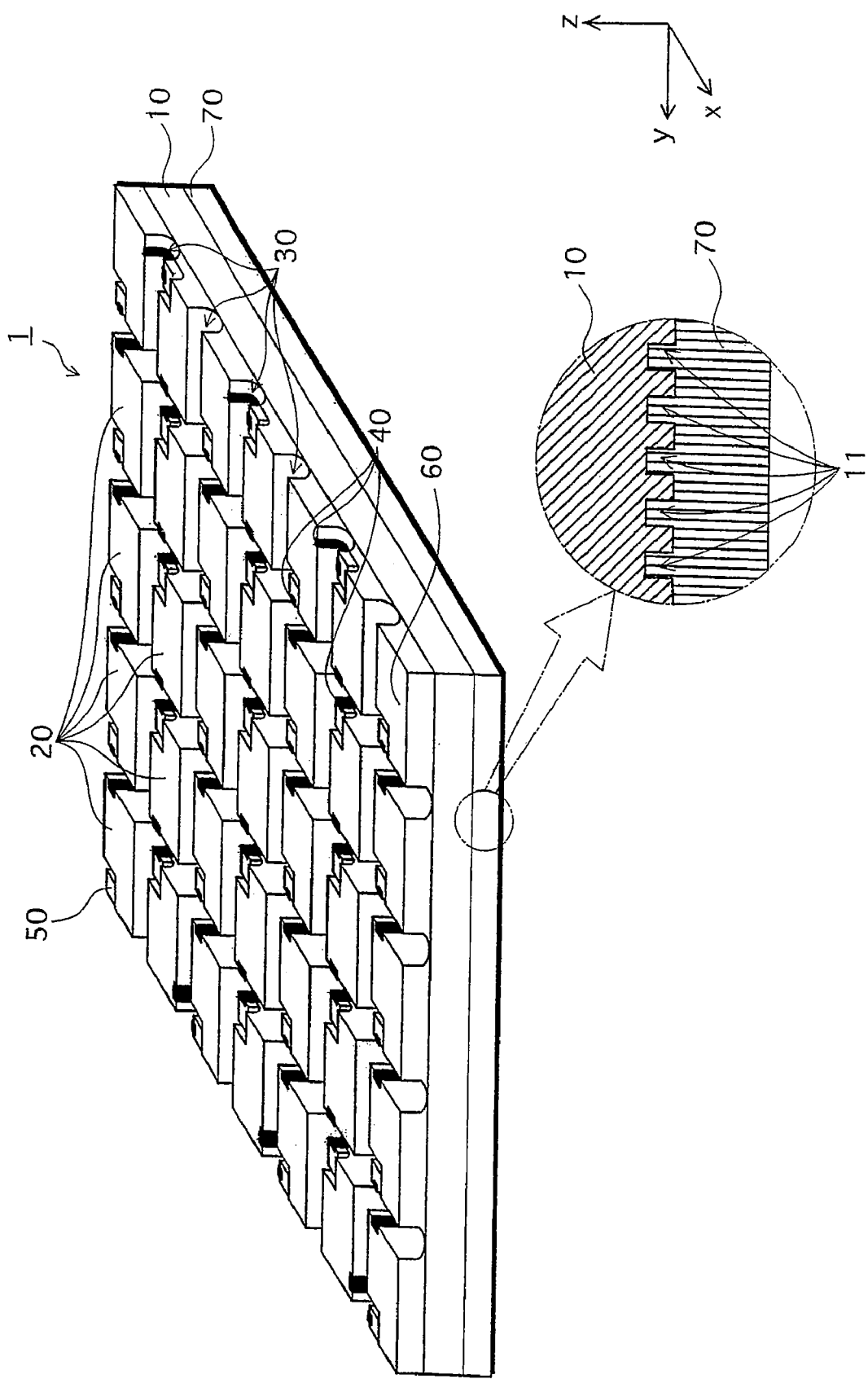
FIG. 1 is a perspective view of a LED chip 1, according to a first embodiment of the present invention.
Figure 2A:
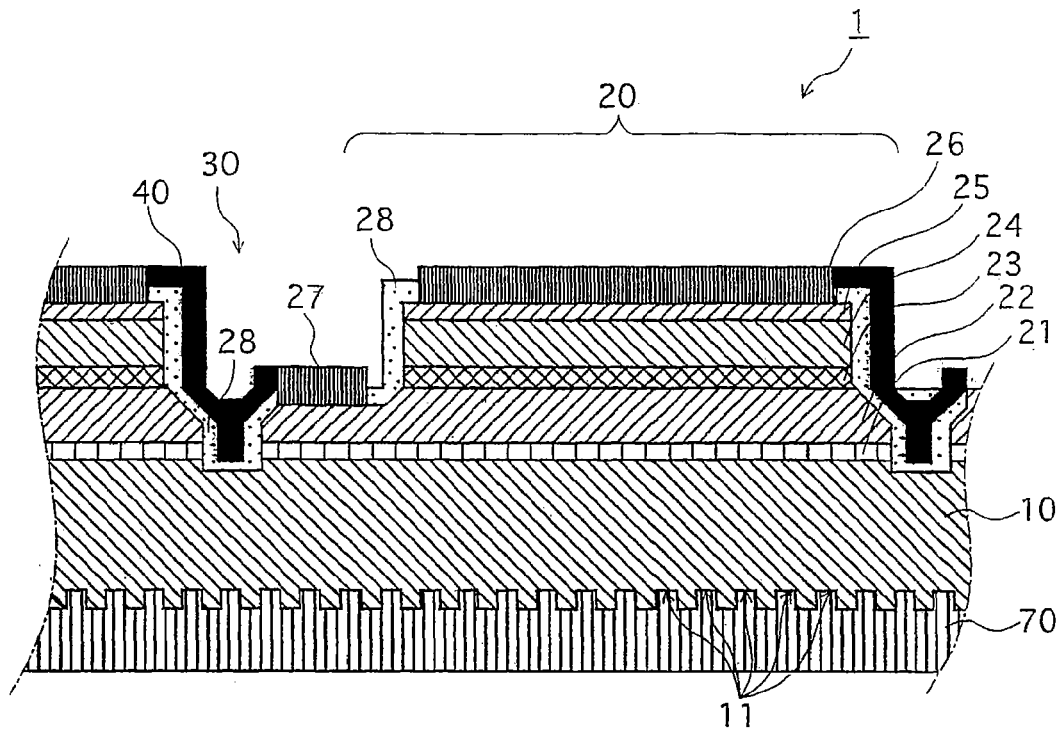
FIG. 2A is a partial sectional view of the LED chip 1.
Figure 2B:
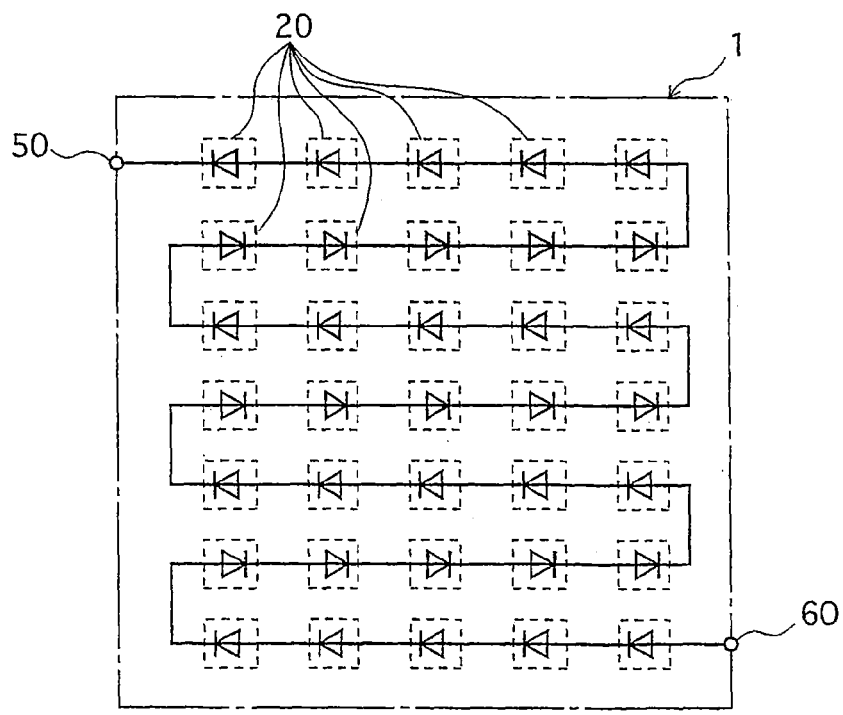
FIG. 2B is a circuit wiring diagram of the LED chip 1.

The LED chip 1 is explained with reference to FIGS. 1 and 2. FIG. 1 shows a perspective view. FIG. 2A shows a partial sectional view, and FIG. 2B shows a circuit wiring diagram, of the LED chip 1.

As shown by FIG. 1, the LED chip 1 is such that plural light-emitting elements 20 are formed on a non-doped GaN substrate 10. The light emitting elements 20 are disposed on the substrate 10 in a matrix of 7×5 in x and y directions respectively to form total 35 regions on the substrate. A size of one light emitting element 20 is 285 μm in x direction, and 400 μm in y direction. A size of the LED chip 1 is 2 mm×2 mm, for example.

Each of the light emitting elements 20 on the LED chip 1 constitutes a diode structure, and is separated from other light emitting elements 20 by separation grooves 30, and a bridge wiring 40 electrically connects the 35 diode structures in series.

As shown in FIG. 1, a cathode electrode 50 and an anode electrode 60 on each of a pair of opposing corners of the LED chip 1. These electrodes 50 and 60 are an n-electrode and a p-electrode, respectively, of the light emitting elements 20 that is positioned at the both edges of the 35 light emitting elements 20 serially connected by the bridge wiring 40.

Further, as shown in an enlarged part in FIG. 1, a lower surface of the non-doped GaN substrate 10 has depressions 11, and a membrane 70 covers the depressions. There is no gap between the membrane 70 and the non-doped GaN substrate 10, even at bottoms of the depressions 11. In other words, a surface having depressions of the non-doped GaN substrate 10 is densely covered with the membrane 70.

A negative direction along a z-axis in FIG. 1 (downside of the drawing) is a direction in which light from the LED chip 1 is irradiated. The depressions 11 on the substrate 10 are formed in order that the irradiated light is easily diffused or transmitted and to virtually lower the refractive index difference at the boundary (a irradiation surface). Details regarding this are described in the patent and non-patent references cited in the above, and further explanation is not given here.

As shown in FIG. 2A, when the LED chip 1 is viewed in section, a GaN buffer layer 21 (30 nm thick), an n-GaN clad layer 22 (Si doped $3 \times 10^{18}$ cm$^{-3}$, 2 μm thick), a (InGaN/GaN)×6 luminous layer 23 (InGaN is 2 nm thick, and GaN is 8 nm), a p-GaN clad layer 24 (Mg doped $3 \times 10^{19}$ cm$^{-3}$, 200 nm thick), and then a p-GaN contact layer 25 (Mg doped $3 \times 10^{19}$ cm$^{-3}$, 50 nm thick) are layered on the non-doped GaN substrate 10 in a stated order, and finally p-electrodes 26 made of Rh/Pt/Au are formed on a top of the layers.

The (InGaN/GaN)×6 luminous layer 23 indicates a multiplex quantum well structure luminous layer at 6 periods of InGaN/GaN, and irradiates blue light having a wavelength of 460 nm in driving the LED chip 1.

A refractive index of the non-doped GaN substrate 10 is around 2.5, which is substantially the same as a refractive index of the (InGaN/GaN)×6 luminous layer 23. Therefore, the non-doped GaN substrate 10 is more effective to improve the light extraction efficiency in comparison with a conventional LED chip that utilizes a sapphire (refractive index=1.7).

The separation grooves 30 are made so as to reach the non-doped GaN substrate 10, and a $Si_3N_4$ membrane 28 as an insulating film covers a surface of the separation grooves 30. On the shelf shaped n-GaN clad layer 22, n-electrodes 27 made of Ti/Au are formed at the boundary between the light emitting element 20 and the separation grooves 30. The bridge wiring 40 made of Ti/Pt/Au connects the n-electrodes 27 to the p-electrodes 26 on the light emitting element 20 that is next to the n-electrodes 27, in one-to-one relation.

On the other hand, the non-doped GaN substrate 10 has the minute depressions 11 having a square-shaped cross-section (the depressions are at an interval of 1 μm, for example) on all over the lower surface. By having the depressions 11 on the surface of the non-doped GaN substrate 10, the irradiated light from the (InGaN/GaN)×6 luminous layer 23 is easily diffused or transmitted. Further, as described above, the membrane 70 is formed on the surface of the non-doped GaN substrate 10 so as to fill the depressions 11. The membrane 70 is mainly made of polyimide resin that transmits light, and contains yellow phosphor material such as (Sr, Ba)$_2$SiO$_4$:Eu$^{2+}$ and ultrafine particles such as $SiO_2$ dispersed in the membrane. The membrane 70 is formed so as that a surface of the membrane 70 facing away from the luminous layer becomes substantially flat and a thickness is 80 μm at a thinnest part where there is no depression.

A structure of the depressions 11 is called a photonic crystal (PC) or a photonic band gap (PBG) structure, depending on how the depressions are formed, and depressions of such a structure serve a different function other than the light diffusion, i.e. such a structure allows the depressions to transmit light easily.

The thickness of the membrane 70 is set to 80 μm in order that the LED chip 1 as a whole emits white light, by mixing blue exciting light, having a peak wavelength ranged from 400 to 500 nm, from the (InGaN/GaN)×6 luminous layer 23 and yellow light, having a peak wavelength ranged from 550 to 600 nm, generated from the membrane 70 excited by a part of the blue exciting light.

The depressions 11 of the non-doped GaN substrate 10 are square in the present embodiment, as explained above. However, a shape and size of the depressions are not restricted to the above example as long as the shape and size are set in a range that improves the light extraction efficiency. Round or honey-comb depressions, or straight-line grooves may be employed, for example. Note that it is desirable that the depressions 11 are formed at an interval of λ/4 or greater, when the wavelength of the light from the (InGaN/GaN)×6 luminous layer 23 is λ.

As shown in FIG. 2B, the LED chip 1 is such that the 35 light emitting elements 20 are connected in series by the bridge wiring 40 connecting the light emitting elements 20. When supplying the LED chip 1 with a power of 50 mA via the cathode electrode 50 and anode electrode 60, an operational voltage becomes 120 V. When supplying power to the LED chip 1, it is desirable to secure a path to disperse heat generated at the LED chip 1 by connecting to a mounting substrate and such.

Note that, although the LED chip 1 according to the present embodiment has a structure including the plural light emitting elements 20, it is also possible that one LED chip includes only one light emitting element.

[Method of Manufacturing LED Chip 1]

Next, a method of manufacturing the LED chip 1 is explained with reference to FIGS. 3 and 4.

Figure 3A:
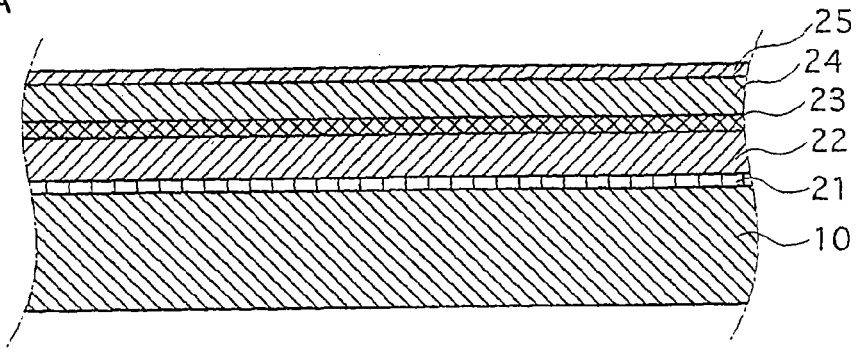
FIG. 3 is a process drawing illustrating a manufacturing process of the LED chip 1.

As shown in FIG. 3A, the GaN buffer layer 21, n-GaN clad layer 22, (InGaN/GaN)×6 luminous layer 23, p-GaN clad layer 24, and p-GaN contact layer 25 are layered in a stated order on the non-doped GaN substrate 10, which is φ5 cm and 300 μm thick, using Metal Organic Chemical Vapor Deposition (MOCVD).

Figure 3B:
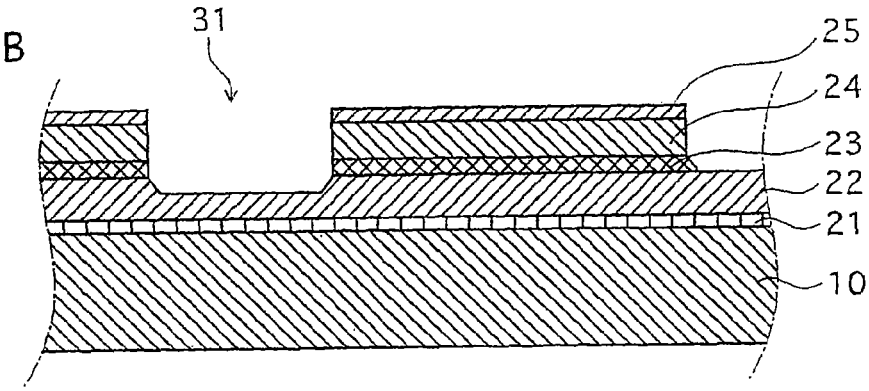

Next, as shown in FIG. 3B, grooves 31 are formed by etching at areas where the separation grooves 30 and n-electrodes 27 are formed. The grooves 31 are as deep as to reach the n-GaN clad layer 22. In forming the grooves 31, although not shown by the drawings, etching is performed after masking the rest of the areas, and the mask is removed after the grooves 31 are formed.

Figure 3C:
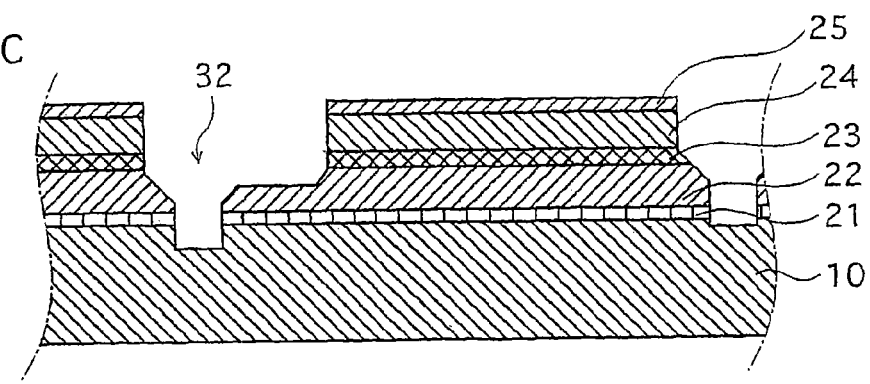

As shown in FIG. 3C, a part of a bottom surface of each of the grooves 31 is further etched. Grooves 32 are thus formed and penetrate the n-GaN buffer layer 21 to reach the non-doped GaN substrate 10. The separation grooves 30 are formed based on the grooves 32. In order to form the grooves 32, it is possible to use a laser instead of etching.

Figure 3D:
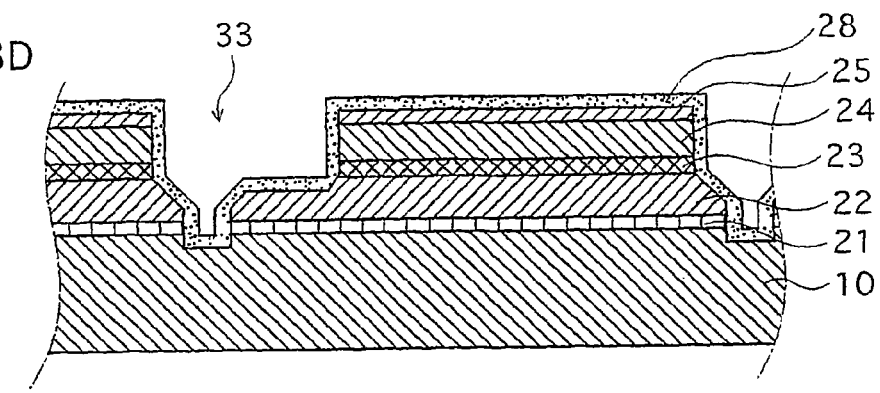

As shown in FIG. 3D, the $Si_3N_4$ membrane 28 is formed so as to cover an entire surface including wall surfaces of the grooves 32. The $Si_3N_4$ membrane 28 is formed using such as spattering, in order to achieve insulation and surface protection. By covering the surfaces of the grooves 32, the grooves 33 are formed. The grooves 32 make only low cuts in the substrate 10, and very superficial, and therefore the grooves 32 will not break the substrate 10.

Figure 4E:
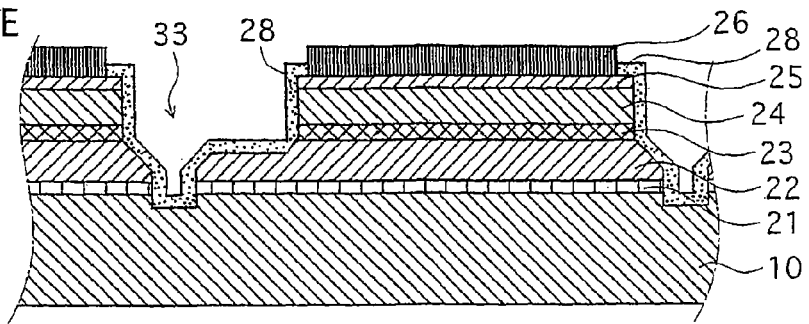
FIG. 4 is a process drawing illustrating a manufacturing process of the LED chip 1.

Next, as shown in FIG. 4E, parts of the $Si_3N_4$ membrane 28 where the p-electrodes 26 are to be formed are removed by etching, and then films of Rh/Pt/Au are formed by evaporation. Thus, the p-electrodes 26 are formed.

Figure 4F:
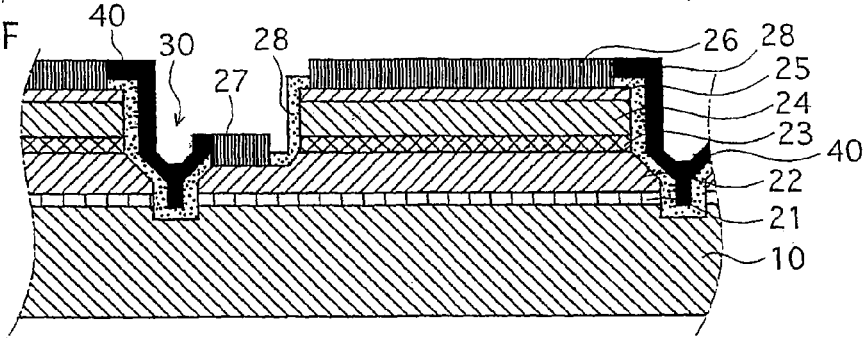

Then, as shown in FIG. 4F, parts of the $Si_3N_4$ membrane 28 where the n-electrodes 27 are to be formed on the shelf part next to each of the separation grooves 30 are removed by etching, and then films of Ti/Au are formed by evaporation. Thus, the n-electrodes 27 are formed. Similarly, the bridge wiring 40 made of Ti/Pt/Au is formed so as to connect each p-electrode 26 and n-electrode 27 of two light emitting elements 20 that are next to each other.

Manufacturing steps from here are the most characteristic part in the present embodiment.

Figure 4G:
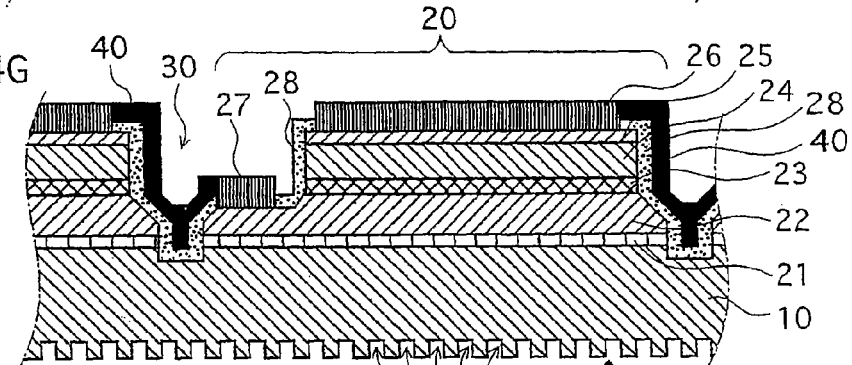

As shown in FIG. 4G, a back surface of the non-doped GaN substrate 10 (downside of the drawing) is polished until thickness becomes 150 μm using lap polish. Then, as shown in an enlarged part of FIG. 4G, the depressions 11 are etched on the back surface of the non-doped GaN substrate 10. The depressions 11, as described above, are formed at an interval of 1 μm, and an opening of each depression is rectangular.

Figure 4H:
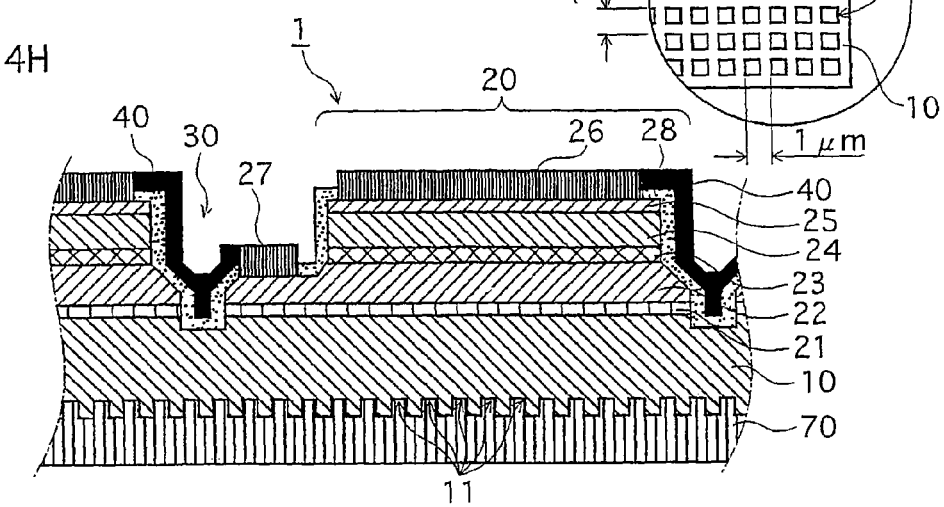

As shown in FIG. 4H, the polyimide acid solution, containing particles of yellow phosphor material such as $(Sr, Ba)_2SiO_4:Eu^{2+}$, and $SiO_2$ in a dispersed state, is applied to the back surface of the non-doped GaN substrate 10 on which the depressions 11 are formed. The solution is filled in the depressions 11 so that no air bubble is caused inside. And, after heating and hardening at a temperature of 350° C., the membrane is formed.

The formed membrane is polished so that the LED chip 1 irradiates white light generated by the light from the (InGaN/GaN)×6 luminous layer 23 mixed with the light excited by the phosphor material in the membrane. For polishing, lap polishing is performed until the thickness of the membrane becomes 80 μm, for example. By this, the membrane 70 is finished.

As a main component of the membrane 70, it is also possible to use such as an epoxy resin or a hard silicone resin, in addition to the above-mentioned polyimide. In this case, it is possible to harden the membrane by heating at a temperature 150° C. Further, the thickness of the membrane 70 varies according to a relation between the blue light from the (InGaN/GaN)×6 luminous layer 23 and a proportion of the yellow phosphor contained in the membrane 70. Therefore, in the polishing step, the membrane 70 is polished to a thickness with which a specific color temperature is obtained without fail.

Finally, although not shown in the drawing, the LED chip 1 is finished by dicing the membrane into individual LED chips 1.

In the present embodiment, the non-doped GaN substrate 10 was used as a substrate. However, it is also possible to use a low cost substrate such that a high resistant layer such as an AlGaN layer is formed on an n-GaN substrate. In this case, it is necessary to form the separation grooves so that the high resistant layer is not removed.

[Structure of LED Module 100]

A LED module 100 having the above LED chip 1 is explained with reference to FIG. 5.

Figure 5A:
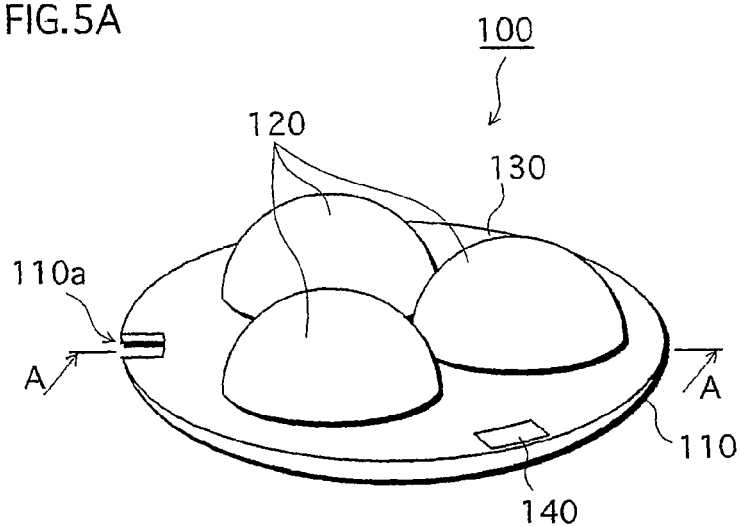
FIG. 5A is a perspective view of a LED module 100 viewed from outside.

As shown in FIG. 5A, the LED module 100 comprises a disk shaped composite substrate 110 with a diameter of φ5 cm and three light emitting units 120 provided on the composite substrate 110. The composite substrate 110 includes a notch 110a used when the LED module is attached to the lighting apparatus 200, and terminals 130 and 140 with which power is supplied from the lighting apparatus 200. Although not shown in the drawing, the guiding hole is formed on a substantial center of the composite substrate 110 in order to improve operationality when attached to the lighting apparatus 200.

The three light emitting units 120 on the composite substrate 110 each include the LED chip 1 mounted thereon. Details are explained with reference to a partial sectional view in FIG. 5B.

Figure 5B:
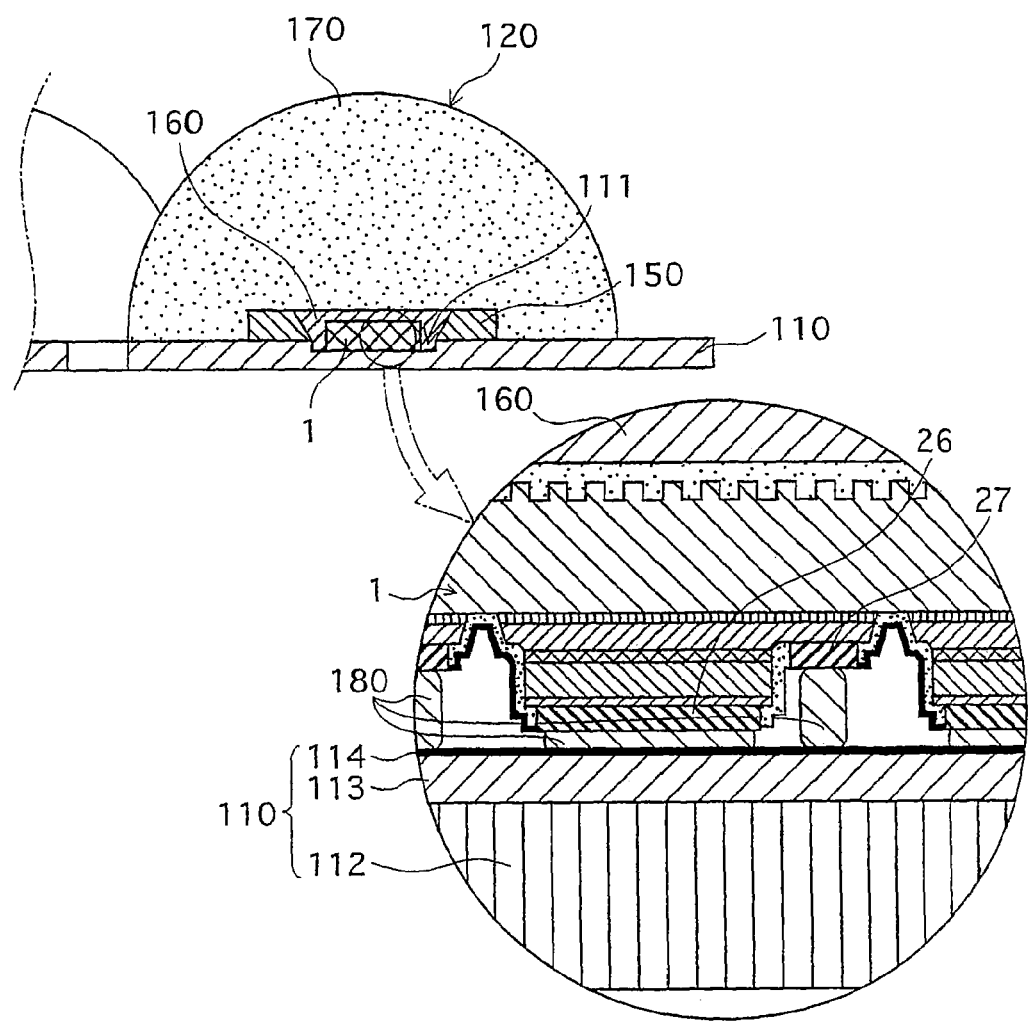
FIG. 5B is a partial sectional view of the LED module 100.

As shown in FIG. 5B, the LED chip 1 is mounted at a bottom surface of a depression 111 of the composite substrate 110. The LED chip 1 is mounted to the composite substrate 110 using flip-chip bonding, and has an excellent heat dispersion property. A reflective mirror 150 made of aluminum is formed so as to surround the depression 111 in which the LED chip 1 is mounted. The depression 111 surrounded by the reflective mirror 150 is filled with a resin layer 16, and thereby the LED chip 1 is sealed. Examples of material for the resin layer 160 include a silicon resin and a epoxy resin.

An entire part of the reflective mirror 150 and the resin layer 160 that covers the LED chip 1 are further covered by a lens layer 170. Such as a resin material that can be formed in one-piece by molding and a glass material may be used for the lens layer 170. An internal structure of the LED module 100 is explained using FIG. 5B illustrating a sectional view taken at line A-A of FIG. 5A.

As shown in an enlarged part of FIG. 5B, the p-electrodes 26 and n-electrodes 27 of the LED chip 1 are connected to the wiring layer 114 of the composite substrate 110. In addition to an Au coating applied to a surface of the wiring layer 114, Au layers 180 are inserted between each of the electrodes 26 and 27 and the wiring layer 114. These Au layers are Au bumps that have been disposed on the wiring layer 114 when the LED chip 1 is mounted on the composite substrate 110 by flip-chip bonding.

Also as shown in an enlarged part of FIG. 5B, the composite substrate 110 includes an aluminum layer 112 with 1 mm in thickness, an alumina composite insulating layer 113, and the wiring layer 114 made of copper layered in a stated order. Moreover, although not shown in FIG. 5, an alumina composite insulating layer 115 is layered on the wiring layer (See FIG. 6).

Thickness of the alumina composite insulating layers 113 and 115 is 100 μm, and thickness of the wiring layer 114 is 25 μm.

The p-electrodes 26 and n-electrodes 27 on the LED chip 1 are mounted on the wiring layer 114 in flip-chip bonding. In FIG. 1, predetermined pads on the wiring layer 114 to which the cathode electrode 50 and anode electrode 60 are connected are electrically connected to the terminals 130 and 140, respectively. By this, when driving the LED module 100, power is supplied to the LED chip 1 via the wiring layer 114.

The LED module 100 according to the embodiment of the present invention includes three light emitting units 120, each of which has a structure described above.

While the p-electrodes 26 and n-electrodes 27 on the light emitting elements 20 that are next to each other are connected by the bridge wiring 40 as explained above, the p-electrodes 26 and n-electrodes 27 are connected by being mounted on the composite substrate 110, in order to ensure the connection within the LED chip 1 and to disperse the heat generated in the LED chip 1 to the composite substrate 110 without fail, when driving to emit light.

[Mounting LED Chip 1 to Composite Substrate 10]

Figure 6:
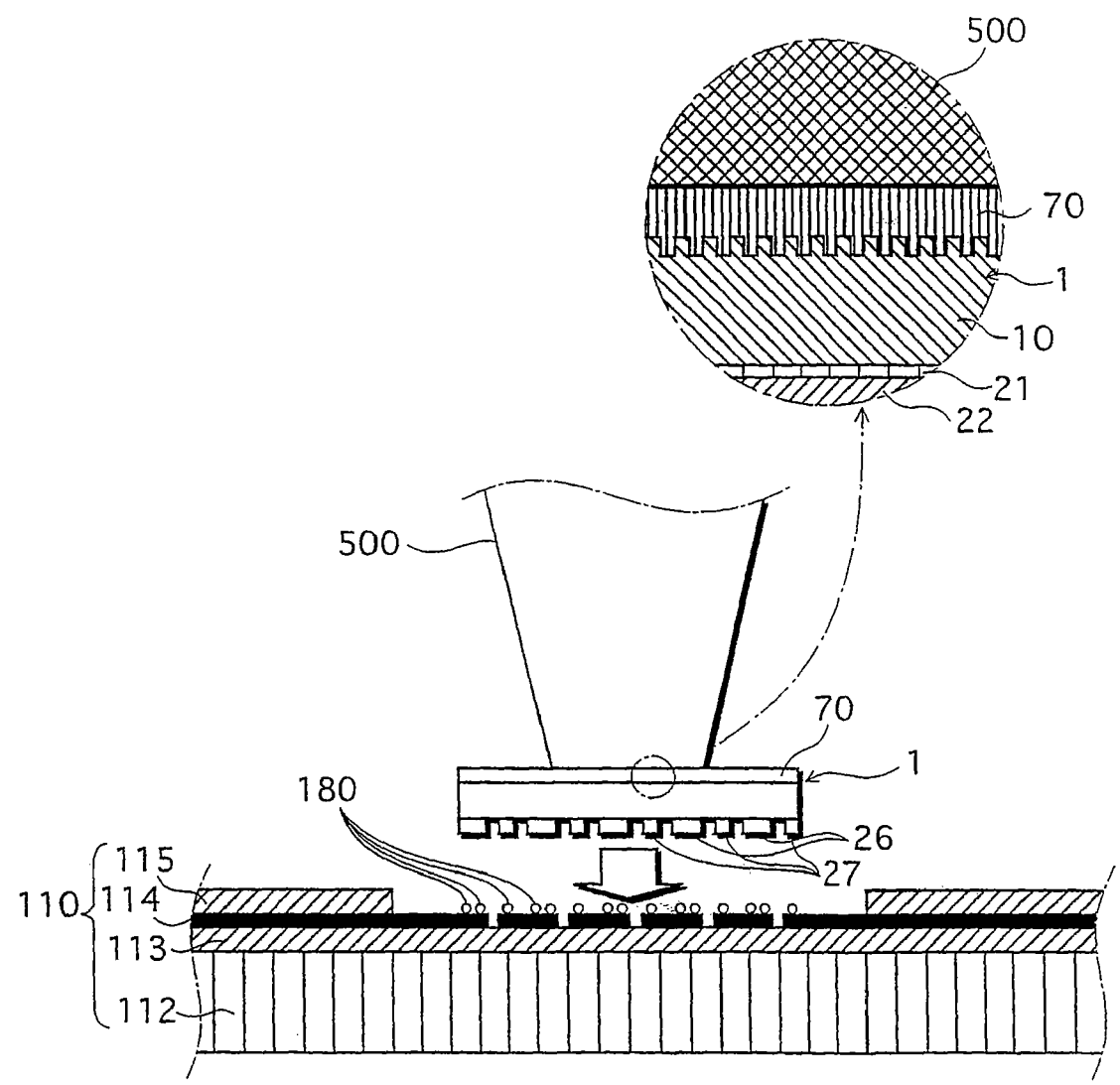
FIG. 6 is a schematic view illustrating a step of flip-chip bonding of the LED chip 1 to a mounting substrate 110.

Next, a method of mounting the LED chip 1 to the composite substrate 110 with reference to FIG. 6 and FIG. 7.

Figure 7A:
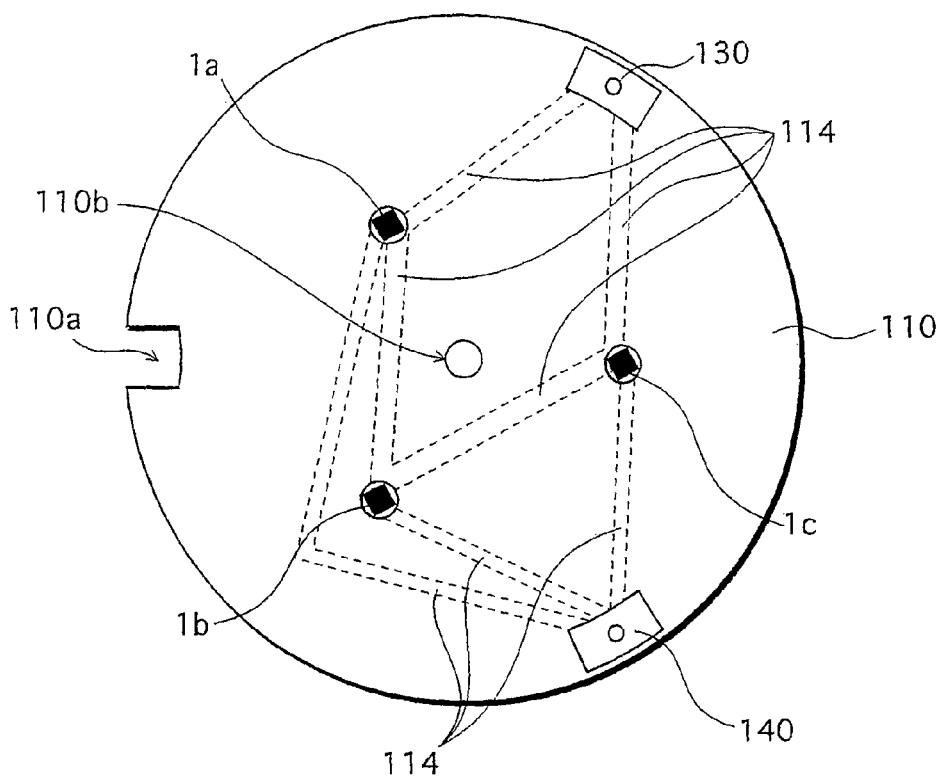
FIG. 7A is a front view of the mounting substrate 110.

As shown in FIG. 6, the alumina composite insulating layer 115, which is a top layer of the composite substrate 110, is partially removed at an area where the LED chip 1 is mounted. The composite substrate 110 has areas on which three LED chips 1a, 1b, and 1c are mounted, respectively, as shown in FIG. 7A, and the wiring layer 114 connects the positive and negative electrodes of each chip to the terminals 130 and 140, respectively.

Figure 7B:
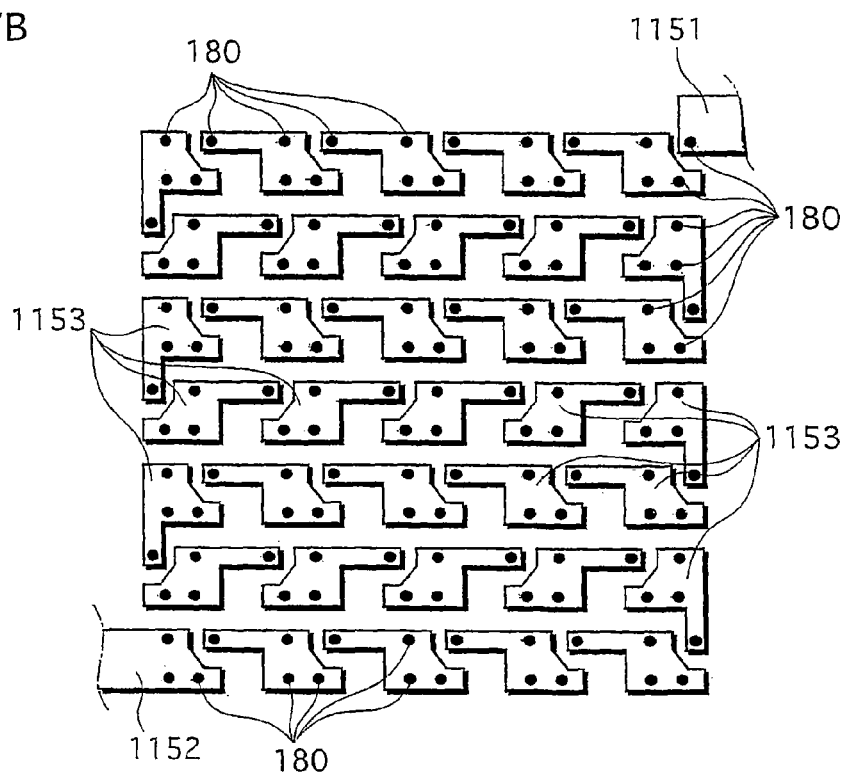

As shown in FIG. 7B, the wiring layer 114 is, at the areas where LED chips 1a, 1b, and 1c are mounted, patterned to a cathode pad 1151, an anode pad 1152, and island pads 1153 each correspond to each of 35 light emitting elements 20 of the LED chip 1. Among the pads, the cathode pad 1151 and anode pad 1152 are connected to the terminals 130 and 140, respectively, as described above. In addition, Au bumps 180 are formed on each of the pads 1151-1153.

The island pads 1153 have a function to improve the connectivity between the p-electrodes 26 and n-electrodes 27 each on the light emitting elements 20 that are next to each other, as well as a function to transmit the heat generated in the LED chip 1 to the composite substrate 110 at high efficiency. The heat transmitted to the composite substrate 110 is dispersed from the aluminum layer 112 via the wiring layer 114 and alumina composite insulating layer 113. Each of the island pads 1153 is formed independently, and has the above explained important functions.

Back to FIG. 6, when the LED chip 1 is mounted to the composite substrate 110 by flip-chip bonding, a vacuum collet 500 sticks to a surface of the LED chip 1 on which the membrane 70 is formed and then moves down the LED chip 1 till the electrode 26 and 27 come into contact with the Au bumps 180 on the wiring layer 114 of the composite substrate 110. Next, while the electrode 26 and 27 are pressed against the Au bumps 180, ultrasonic waves are applied from the vacuum collet 500. The Au bumps 180 becomes soft by the ultrasonic waves applied to the bumps, and the bonding is finished when application of the ultrasonic waves stops.

As shown in an enlarged part of FIG. 6, the membrane 70 is formed on the surface of the LED chip 1 that the vacuum collet 500 sticks to. Because the surface of the membrane 70 that the vacuum collet 500 sticks to is substantially flat as shown in the drawing, it is possible that the vacuum collet 500 sticks to the surface without fail. In addition, the surface that is substantially flat reduces loss of energy in applying the ultrasonic waves from the vacuum collet 500 via the surface.

Further, the membrane 70 also has a function to protect the depressions 11 of the non-doped GaN substrate 10 from being destroyed while the ultrasonic bonding.

[Lighting Apparatus 200 Having LED Module 100]

A lighting apparatus 200 having a LED module 100 is explained next with reference to FIGS. 8 and 9. FIG. 8 illustrates a perspective view and a bottom view of the lighting apparatus 200. FIG. 9 illustrates an explosion view relating to attachment of the LED module 100.

Figure 8A:
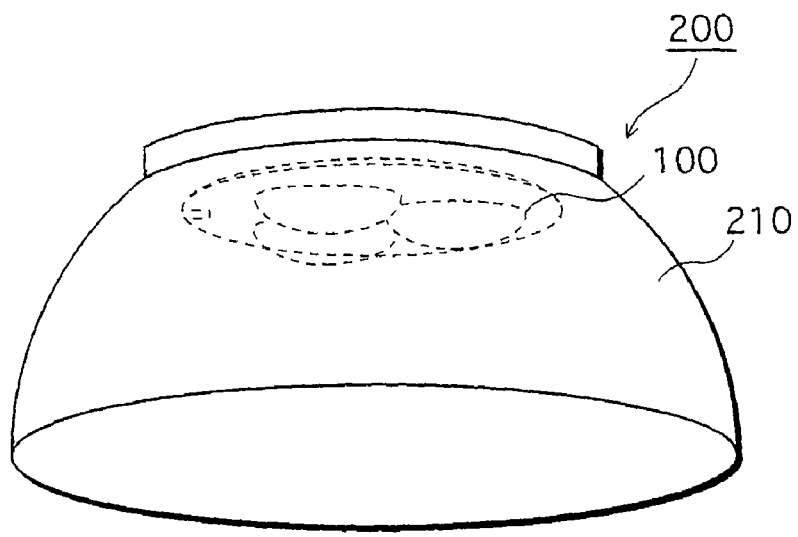
FIG. 8A is a partial sectional view of a lighting apparatus 200 according to the first embodiment.
Figure 9:
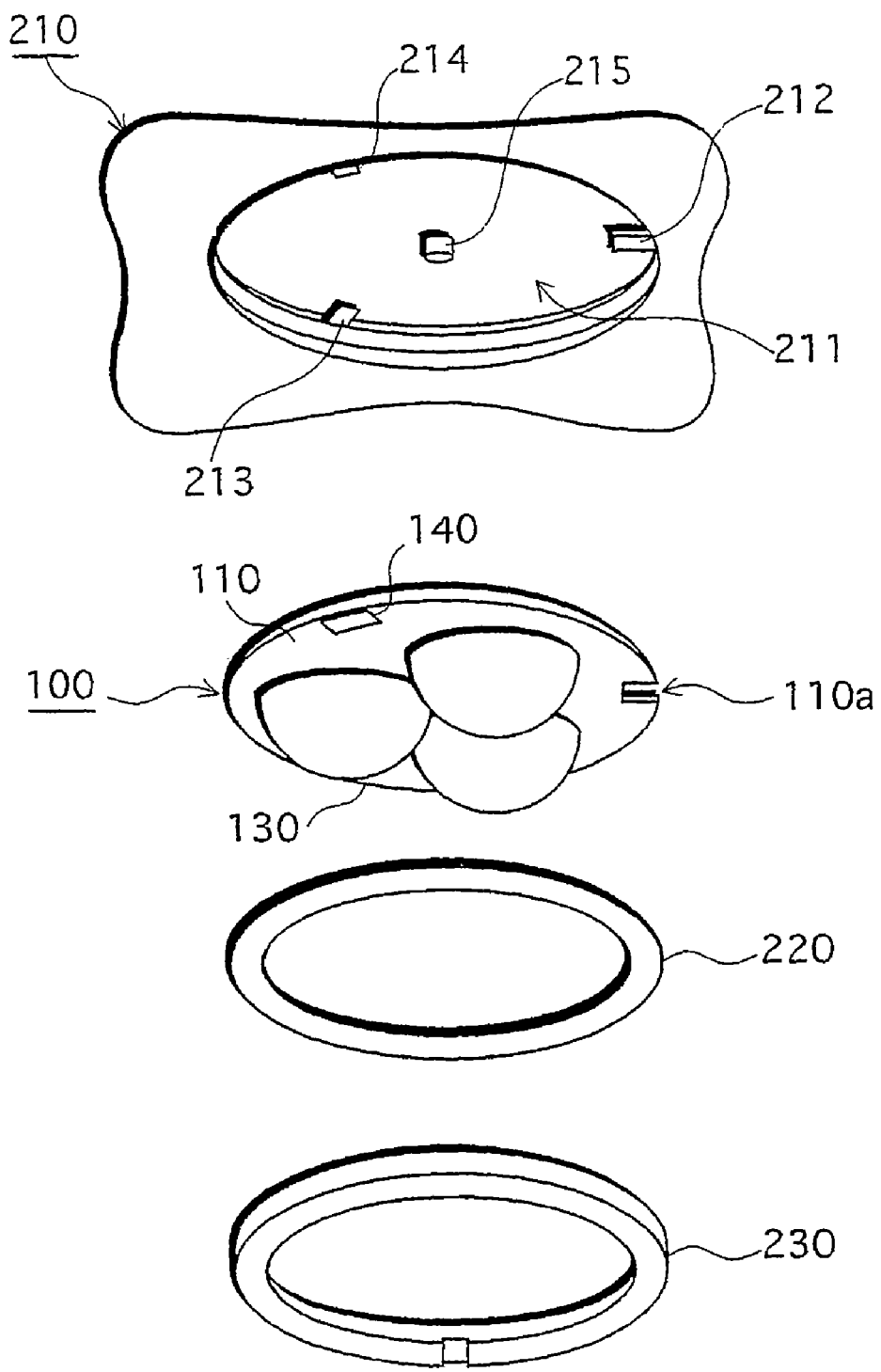
FIG. 9 illustrates a process drawing illustrating an attachment process of a LED module 100 to a socket 210 of the lighting apparatus 200.

As shown in FIG. 8A, the lighting apparatus 200 comprises a horn-shaped member 210 and the LED module 100 that is attached inside the horn-shaped member 210. The horn-shaped member 210 includes a power conversion circuit (not shown in the drawings) for converting commercially supplied AC power (100 V and 50/60 Hz, for example) into DC power that is necessary to drive the LED module 100 to emit light.

Figure 8B:
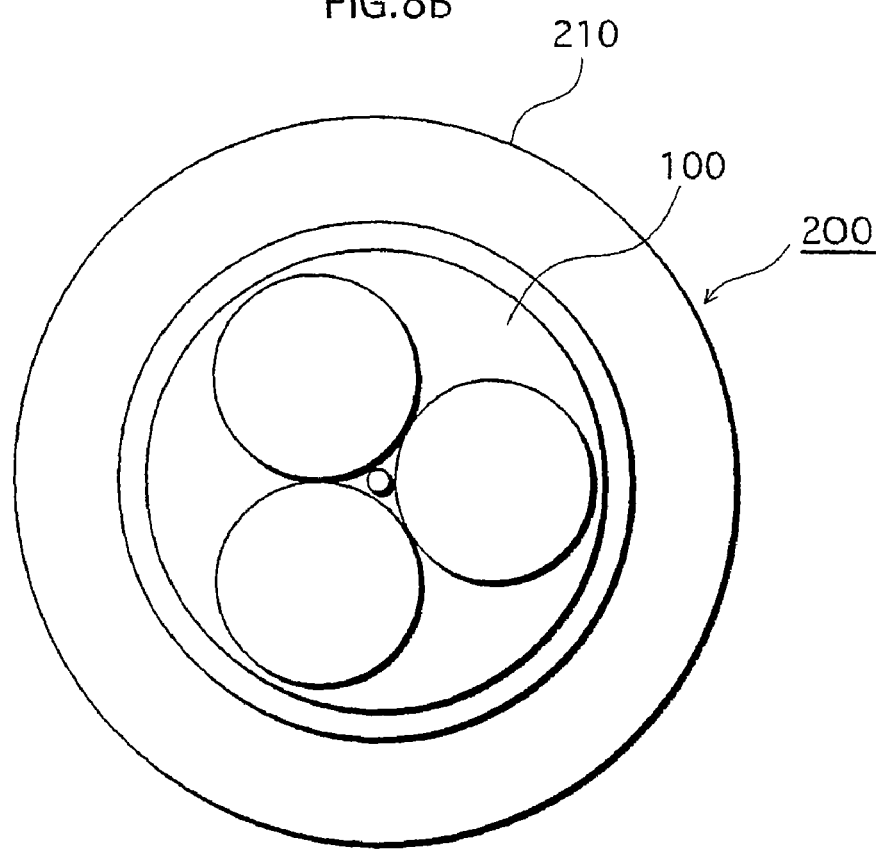
FIG. 8B is a bottom view of the same.

As shown in FIG. 8B, the LED module 100 is disposed so that the aluminum layer 112 of the composite substrate 110 is closely attached to an attaching surface inside the horn-shaped member 210 of the lighting apparatus 200.

Next, as shown in FIG. 9, a round depression 211 that corresponds to a shape of the composite substrate 110 of the LED module 100 is formed on the attaching surface of the horn-shaped member 210 to which the LED module 100 is attached. The bottom of the depression 211 is substantially flat, and a female screw (not shown in the drawings) is disposed at a part closer to an opening of the depression 211 on an inside wall. A guide 212 and flexible terminals 213 and 214 are disposed on the inside wall between the female screw and the bottom surface. Positions of the guide 212 and the flexible terminals 213 and 214 correspond, respectively, to positions of the notch 110a and terminals 130 and 140 of the LED module 100. In addition, a guide pin 215 is disposed at a center of the bottom surface of the depression 211 of the horn-shaped member 210.

The flexible terminals 213 and 214 are flexible and not attached to the bottom surface of the depression 211 of the horn-shaped member 210. When inserting the LED module 100 into the depression 211, both the flexible terminals 213 and 214 are flexed along the inside wall of the depression 211 in advance, before inserting the LED module 100.

In order to attach the LED module 100 to the horn-shaped member 210 having the above structure, the guide 212 is inserted into a guiding hole of the LED module 10, and the LED module 100 is set into the bottom surface of the horn-shaped member 210 by fitting the notch 110a along the guide pin 215. Then, when the LED module 100 is placed on the bottom surface of the depression 211 of the horn-shaped member 210, the flexible terminals 213 and 214 that have been flexed along the inside all of the depression 211 are cranked so as to be connected to the terminals 130 and 140 of the LED module 100, respectively. After that, an O-shaped ring 220 is placed at a circumference of the LED module 100, and a ring-shaped screw 230 is screwed into the female screw disposed on the inside wall of the depression 211. When the ring-shaped screw 230 and female screw are fully screwed together, the attachment of the LED module 100 to the horn-shaped member 210 is completed.

In the lighting apparatus 200 according to the present embodiment, silicone grease is applied between a back side of the LED module 100 and the bottom surface of the depression 211 of the horn-shaped member 210 in order to improve the heat dispersion efficiency. In addition, a high reflection finish is applied to an inside wall of a lampshade part of the horn-shaped member 210 in order to extract light from the LED module 100 at a high light extraction efficiency.

In the lighting apparatus 200 having the above structure, a current 150 mA is supplied to the LED module 100 via the terminals 130 and 140 after converting the commercially supplied AC power into the DC power at the power conversion circuit in the horn-shaped member. In the LED module 100 to which the current is supplied, the three light emitting units 120 emit the white light. At this time, the heat generated in the LED chip 1 is dispersed to the horn-shaped member 210 via the aluminum layer 112 of the composite substrate 110. Therefore, with the lighting apparatus 200, it is possible to suppress deterioration of the LED chip 1 and to maintain high luminous efficiency, even when the LED chip 1 is driven to emit light for an extended length of time.

Further, by high reflection finishing applied the lampshade part of the horn-shaped member 210, more than 90% of the white light from the LED module 100 is extracted from the lighting apparatus 200.

Figure 10:
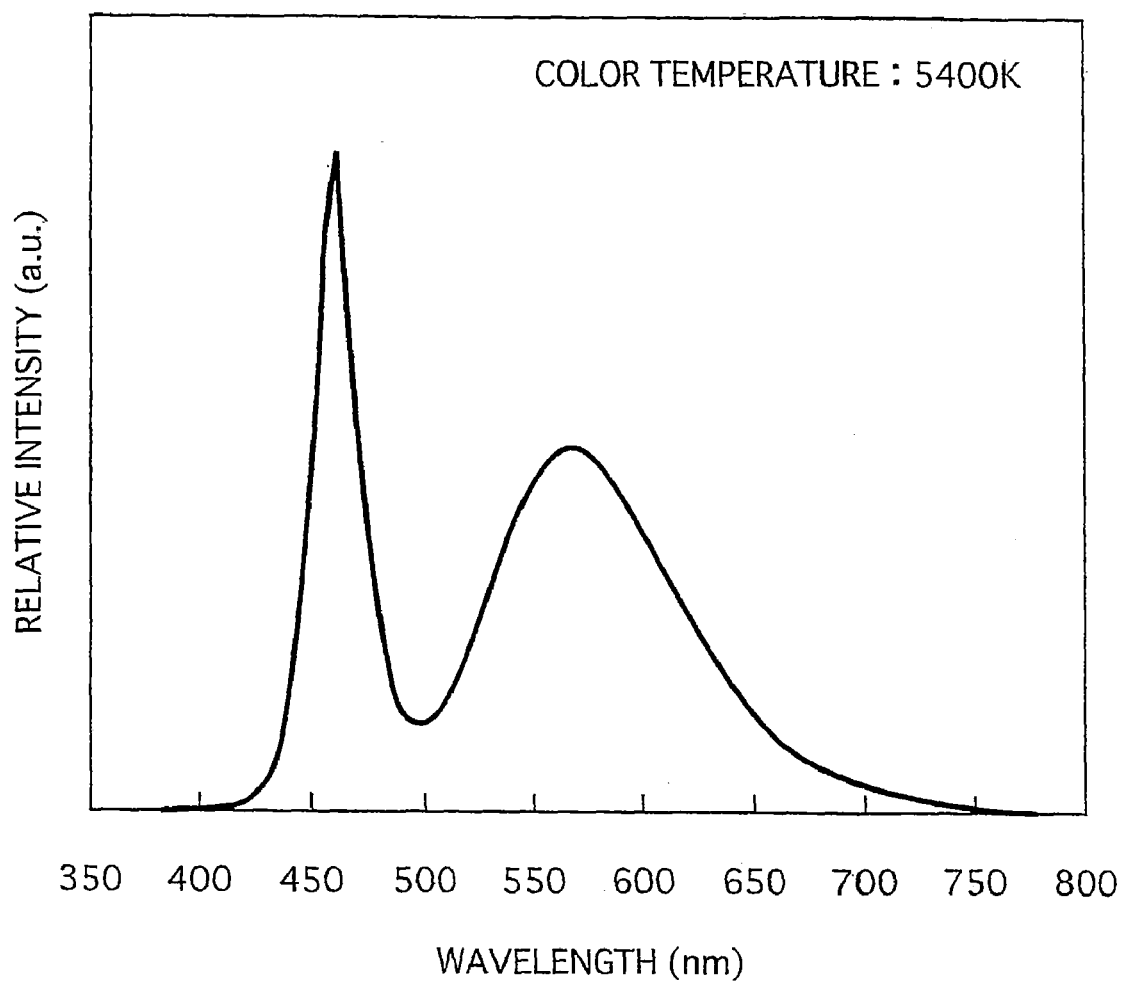
FIG. 10 shows emission spectrum of the lighting apparatus 200.

A spectral distribution of the white light irradiated by the lighting apparatus 200 according to the present embodiment is illustrated in FIG. 10. As shown in FIG. 10, the lighting apparatus 200 according to the present embodiment irradiates the white light having a color temperature of 5400 K and an average color rendering index (CRI) of 70. A relative intensity of an emission spectrum becomes its peak in vicinity of wavelengths 460 nm and 560 nm, and especially sharp in vicinity of wavelengths 460 nm. A total luminous flux is 1000 lm, and an on-axis luminous intensity is 2000 cd.

With the lighting apparatus 200 according to the present embodiment, the white light is obtained by mixing blue light from the (InGaN/GaN)×6 luminous layer 23 and yellow light that the membrane 70 emits when excited, and accordingly, the CRI is around 70. However, by having the membrane 70 contain such as Ca—Al—Si—O—N oxynitride phosphor glass that irradiates red light, it is possible to improve the CRI.

[Advantages of LED Chip 1, LED Module 100 Using LED Chip 1, and Lighting Apparatus 200 Using LED Chip 1]

As described above, the LED chip 1 according to the present embodiment is such that the depressions 11 are disposed on the surface of the non-doped GaN substrate 10 facing away from the luminous layer, and the membrane 70 is formed so as to cover the depressions 11. Accordingly, as in FIG. 6, when the LED chip 1 is mounted by flip-chip bonding to the composite substrate 110, the depressions 11 on the non-doped GaN substrate 10 are protected. Further, misalignment of the position when mounting is suppressed, because the vacuum collet 500 sticks to the LED chip 1 firmly in flip-chip bonding. Moreover, when the vacuum collet 500 applies the ultrasonic waves, the membrane 70 prevents the ultrasonic energy from weakening in transmission between the vacuum collet 500 and the LED chip 1, and thus mounting is performed without fail.

With the LED module 100 having the LED chip 1 and the lighting apparatus 200 having the LED chip 1, it is possible to obtain high light extraction efficiency, because the depressions 11 of the non-doped GaN substrate 10 of the LED chip 1 are protected. In addition, the LED module 100 having the LED chip 1 and the lighting apparatus 200 having the LED chip 1 have high light emission efficiency, because the attachment is done firmly when mounting.

Note that the LED chip 1 according to the present embodiment also has an advantage such that there is no obstacle such as an electrode which blocks the light on a side which light from the luminous layer is irradiated, and therefore a shadow on an irradiated surface will not appear.

Second Embodiment

In a second embodiment, a LED chip 3 as an example of the semiconductor light emitting device is explained.

[Structure of LED Chip 3]

Figure 11A:
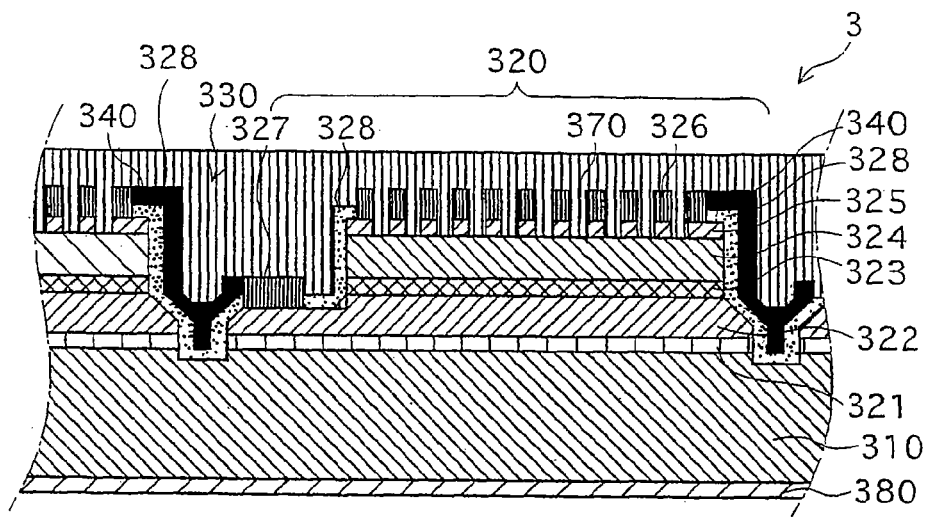
FIG. 11A illustrates a partial sectional view of an LED chip 3 according to the second embodiment.
Figure 11B:
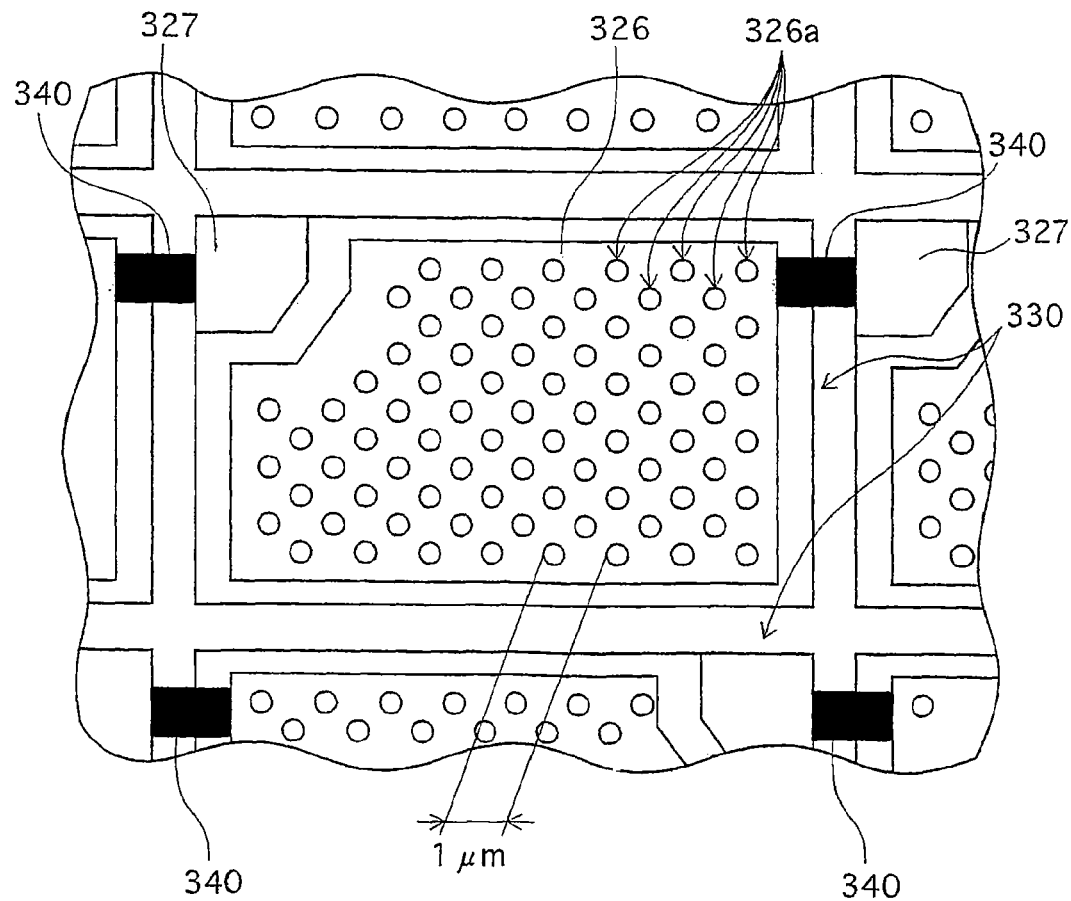
FIG. 11B illustrates configuration of a depression 326a of the bare chip 3.

The LED chip 3 according to the present embodiment has a similar appearance with the LED chip 1 shown in FIG. 1. Specifically, light emitting elements 320 each having a size of 285 μm×400 μm are disposed in a matrix of 7×5, and a size of the LED chip 3 is 2×2 mm. Below, a structure of the LED chip 3 is explained focusing on differences from the LED chip 1, with reference to FIG. 11. FIG. 11A illustrates a partial sectional view of the LED chip 3, and FIG. 11B illustrates a top view of the LED chip 3 without a membrane 370, which will be explained later.

As shown in FIG. 11A, the LED chip 3 is formed in a manner that an AlGaN buffer layer 321 (30 nm thick), an n-$Al_{0.1}Ga_{0.9}N$ clad layer 322 (Si doped $3\times10^{18}$ cm$^{-3}$, 1.5 μm thick), an $In_{0.03}Ga_{0.97}N/Al_{0.05}Ga_{0.95}N\times5$ luminous layer 323 ($In_{0.03}Ga_{0.97}N$ is 3 nm thick, and $Al_{0.05}Ga_{0.95}N$ is 5 nm thick), a p-$Al_{0.1}Ga_{0.9}N$ clad layer 324 (Mg doped $3\times10^{19}$ cm$^{-3}$, 200 nm thick), and a p-GaN contact layer 325 (Mg doped $3\times10^{19}$ cm$^{-3}$, 500 nm thick) are layered on the a non-doped 4H—SiC substrate 310 in a stated order. The $In_{0.03}Ga_{0.97}N/Al_{0.05}Ga_{0.95}N\times5$ luminous layer 323 indicates a multiplex quantum well structure luminous layer with 5 periods of $In_{0.03}Ga_{0.97}N/Al_{0.06}Ga_{0.95}N$, and irradiates near-ultraviolet light having a wavelength of 380 nm in driving the LED chip 3.

A refractive index of the non-doped 4H—SiC substrate 310 is around 2.3, which is substantially the same as a refractive index of the $In_{0.03}Ga_{0.97}N/Al_{0.05}Ga_{0.95}N\times5$ luminous layer 323.

Structures of a separation groove 330, n-electrode 327, an $Si_3N_4$ membrane 328, and a bridge wiring 340 are the same as in the LED chip 1, and not explained here.

As shown in FIG. 11B, depressions are not formed on a back surface of the non-doped 4H—SiC substrate 310 of the LED chip 3, and an Ni/Al/Pt/Au layer 380 is formed. Further, a p-electrode 326 made of Ni/Au is formed on the p-GaN contact layer 325, and a plurality of depressions 326a are formed so as to penetrate from a surface of the p-GaN contact layer 325 to the p-electrode 326. Details about these depressions are explained with reference to FIG. 11B.

As shown in FIG. 11A, the depressions 326a are in a round shape formed at a period of 1 μm, and as described above, the depressions have a function to make light irradiated from the $In_{0.03}Ga_{0.97}N/Al_{0.05}Ga_{0.95}N\times5$ luminous layer 323 is easily dispersed or transmitted. The depressions 326a are formed over an entire area of the p-electrode 326 that irradiates the near-ultraviolet light from the $In_{0.03}Ga_{0.97}N/Al_{0.05}Ga_{0.95}N\times5$ luminous layer 323.

Back to FIG. 11A, an upper surface of the LED chip 3 where electrodes 326 and 327 are formed is entirely covered by the transmission membrane 370. Although not shown in the drawing, the membrane 370 is not formed on parts corresponding to a cathode electrode 50 and an anode electrode 60 in FIG. 1.

The membrane 370 is 50 μm thick, mainly composed of a hard silicon resin having light transmissivity, and is formed so as to fill the depressions 326a completely and so that an external surface is substantially flat. Moreover, the membrane 370 contains, in a dispersed state, a phosphor material that is excited to emit light by the near-ultraviolet light from the $In_{0.03}Ga_{0.97}N/Al_{0.05}Ga_{0.95}N\times5$ luminous layer 323, and fine particles of $SiO_2$. The phosphor material to be selected may be any phosphor material that is excited by the near-ultraviolet light so that the white light is irradiated from the LED chip 3 as a result. Examples of such a phosphor material that may be applied are in the following.

Example 1: A combination of blue phosphor material, green phosphor material, and red phosphor material, emitting blue light, green light, and red light, respectively when excited by the near-ultraviolet light.

Example 2: A combination of the phosphor material in the Example 1, and yellow phosphor material emitting yellow light when excited by the near-ultraviolet light.

Example 3: A combination of blue phosphor material and yellow phosphor material, emitting blue light and yellow light, respectively, when excited by the near-ultraviolet light.

Example 4: A combination of the phosphor material in the Example 3, and red phosphor material emitting red light when excited by the near-ultraviolet light.

Example 5: A combination of blue phosphor material emitting blue light when excited by the near-ultraviolet light, and green phosphor material and red phosphor material, emitting green light and red light, respectively, when excited by the blue light emitted from the blue phosphor material.

Example 6: A combination of blue phosphor material emitting blue light when excited by the near-ultraviolet light, green phosphor material emitting green light when excited by the blue light emitted from the blue phosphor material, and red phosphor material emitting red light when excited by the green light emitted from the green phosphor material.

The above examples are just examples, and do not restrict the present invention. Any other combination with which the white light is obtained from the LED chip 3 may be employed.

In addition, in the above examples, the blue light indicates light having a peak wavelength of light emission falls in a range of 400 nm to 500 nm, the green light indicates light having a peak wavelength of light emission falls in a range of 500 nm to 550 nm, the red light indicates light having a peak wavelength of light emission falls in a range of 600 nm to 680 nm, and the yellow light indicates light having a peak wavelength of light emission falls in a range of 550 nm to 600 nm.

Specifically, the following phosphor materials may be utilized.

Blue Phosphor Material:
$(Ba, Sr)MgAl_{10}O_{17}:Eu^{2+}$
$(Ba, Sr, Ca)_{10}Mg(PO_4)_6Cl_2:Eu^{2+}$ Green Phosphor Material:
$BaMgAl_{10}O_{17}:Eu^{2+}, Mn^{2+}$
$(Ba, Sr)_2SiO_4:Eu^{2+}$
$Y_3(Al, Ga)_5O_{12}:Ce^{3+}$ Yellow Phosphor Material:
$(Y, Gd)_3Al_5O_{12}:Ce^{3+}$
$(Sr, Ba)_2SiO_4:Eu^{2+}$ Red Phosphor Material:
$La_2O_2S:Eu^{3+}$
$CaS:Eu^{2+}$ Moreover, among the substances contained in the membrane 370, $SiO_2$ is ultrafine particles having a diameter ranged from a couple 10 nm to a couple 100 nm. The following may be used as fine particles contained in the membrane 370, other than $SiO_2$ as described above: $Al_2O_3$, $ZnO$, $Y_2O_3$, $TiO_2$, $ZrO_2$, $HfO_2$, $SnO_2$, $Ta_2O_3$, $Nb_2O_3$, $BaSO_4$, $ZnS$, $V_2O_5$, and a mixture of any of the above substances.

A circuit configuration of the LED chip 3 of the above structure is such that the 35 light emitting elements 320 are connected in series as FIG. 2B, and the near-ultraviolet light from the $In_{0.03}Ga_{0.97}N/Al_{0.05}Ga_{0.95}N\times5$ luminous layer 323 is converted into the white light at the membrane 370 and irradiated from the upper surface shown in FIG. 11A. Driving voltage of the LED chip 3 is 120 V, when the heat dispersion is ensured and a current of 50 mA is supplied.

[Method of Manufacturing LED Chip 3]

Next, a method of manufacturing the LED chip 3 is explained with reference to FIG. 12. In manufacturing the LED chip 3, steps after the step shown in FIG. 4F are explained, because the steps from the beginning to FIG. 4F are the same as the method of manufacturing the LED chip 1, although material used is not the same.

Figure 12A:
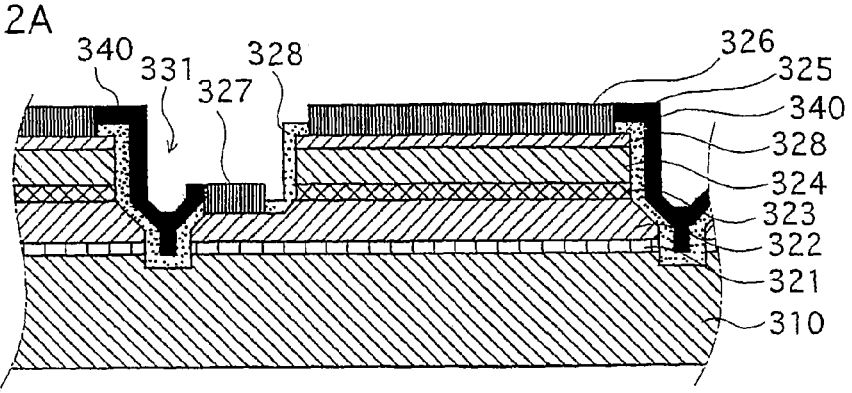
FIG. 12 illustrates manufacturing steps of an LED chip 3.

FIG. 12A shows a step at which formation of the p-electrode 326 and n-electrode 327 is completed.

Figure 12B:
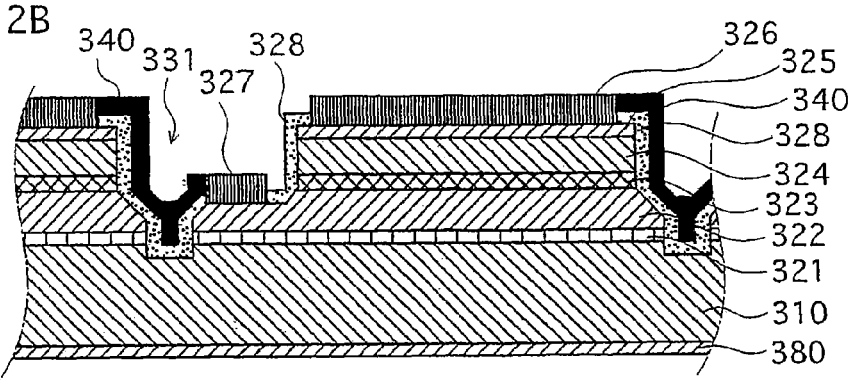

Next, as shown in FIG. 12B, the lower surface of the non-doped 4H—SiC substrate 310 is polished till a thickness of the substrate becomes 150 μm. After the polishing, the Ni/Al/Pt/Au layer 380 is formed on the polished surface using evaporation.

Figure 12C:
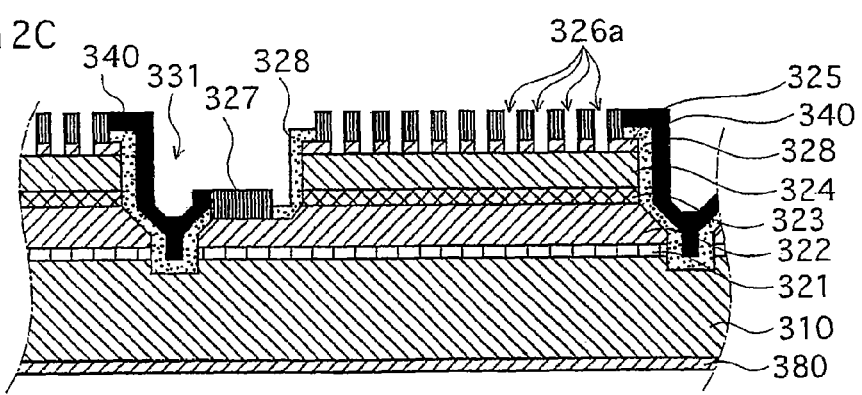
Figure 12D:
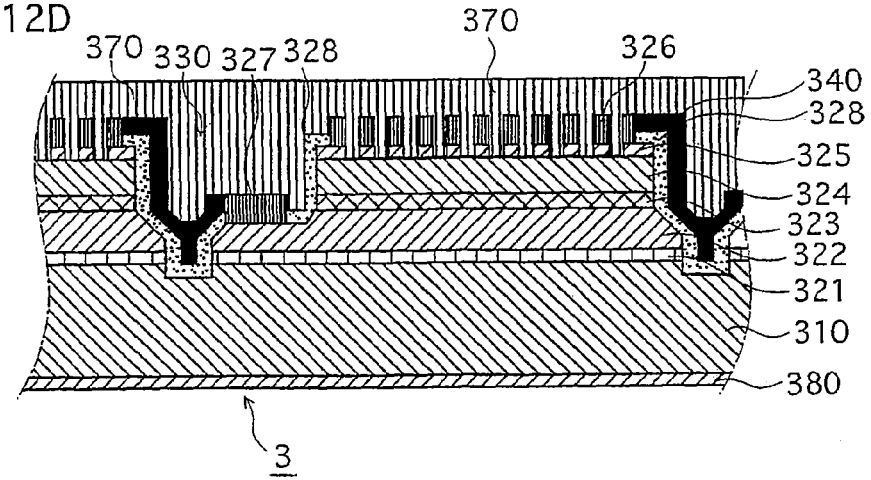

As shown in FIG. 12C, the depressions 326a in a pattern shown in FIG. 11B are etched to an area where the p-electrode 326 is to be formed. Etching is performed in a manner that a surface of the p-GaN contact layer 325 becomes bottom surfaces of the depressions 326a. The depressions 326a are formed at a period of 1 μm and a shape of openings of the depressions 326a is round.

Then silicon resin containing phosphor material is applied to an entire upper surface of the chip, and the membrane 370 is formed after heating the silicon resin at a temperature of 150° C. and hardening. When applying the silicon resin, a special care needs to be taken so that the depressions 326a does not include air inside. In addition, parts corresponding to the cathode electrode and anode electrode are masked so that the silicon resin is not applied.

Finally, after lap polishing is performed until the thickness of the membrane becomes 50 μm, the manufacturing of the LED chip 3 is completed by dicing the membrane into LED chips.

[Structure of LED Module]

Figure 13A:
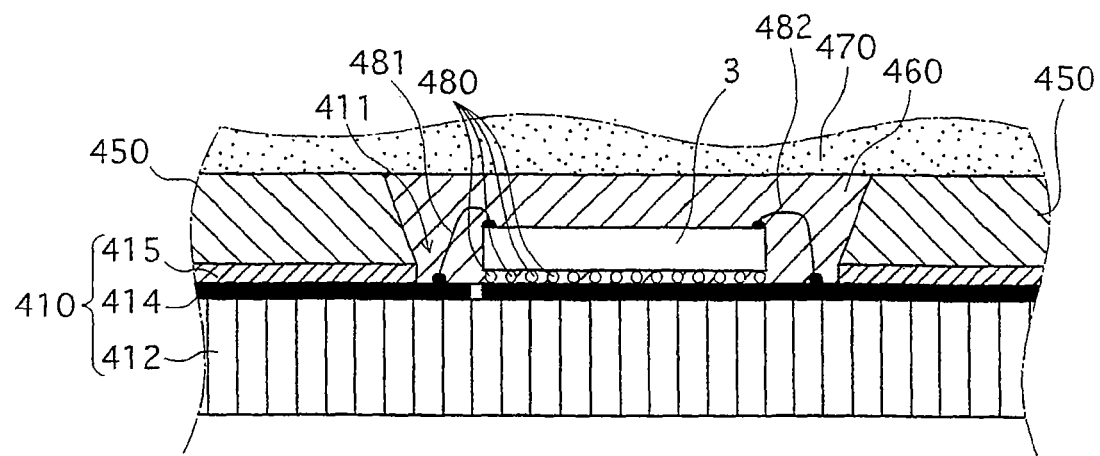
FIG. 13A illustrates a partial sectional view of a mounting substrate 410 on which an LED module 3 is mounted, and FIG. 13B
Figure 13B:
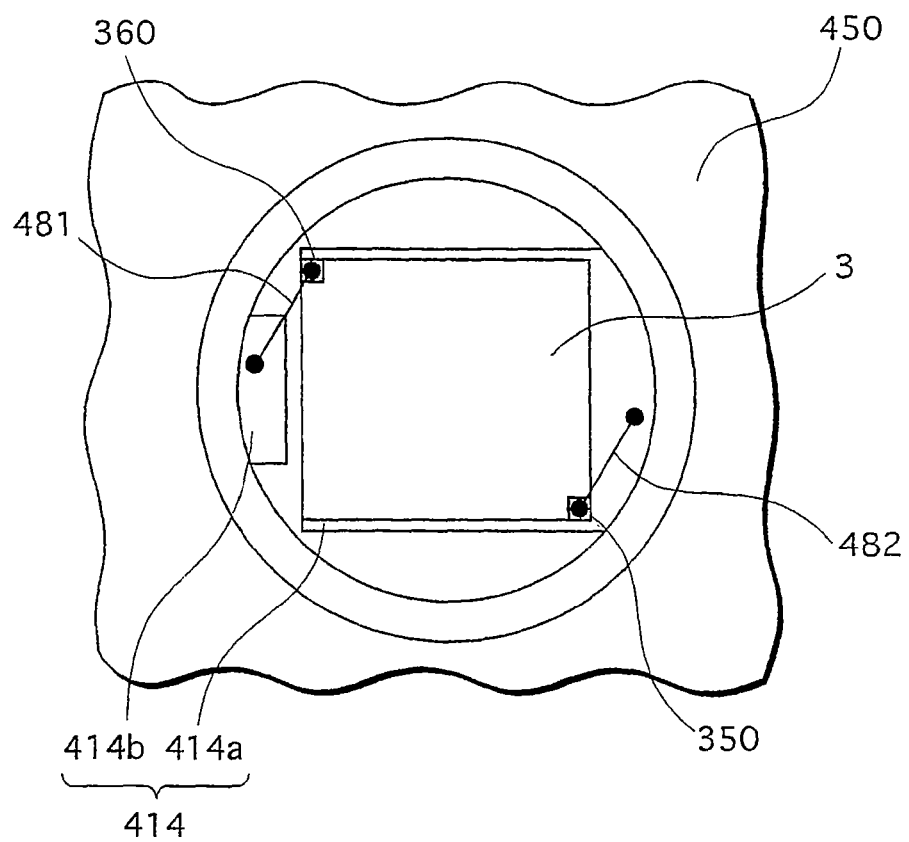

A LED module having the above LED chip 3 is explained with reference to FIG. 13. FIG. 13A illustrates a partial sectional view of the LED module, and FIG. 13B illustrates a connection between the LED chip 3 and a wiring layer 414.

As shown in FIG. 13A, main components of the LED module include a ceramics substrate 410 having a depression 411 whose opening has a diameter of φ3 mm, and the LED chip 3 that is connected to a bottom surface of the depression 411. A reflective mirror 450 made of aluminum (thickness: 0.5 mm, diameter of an upper part of an opening: 4 mm) is attached over the ceramics substrate 410 so as to surround the depression 411. A resin layer 460 is filled in the depression 411 surrounded by the reflective mirror 450, so as to firmly fix the LED chip 3. An upper surface of the resin layer 460 is substantially even with an upper surface of the reflective mirror 450, and a lens layer 470 is formed to cover the upper surfaces.

As shown in FIG. 13A, the ceramics substrate 410 is a substrate with a diameter of φ5 cm and having a laminated structure. The ceramics substrate 410 is structured such that an AlN layer 412 with 0.5 mm in thickness, the wiring layer 414 that is 25 μm in thickness and made of copper or tungsten with, and a ceramics layer 415 are layered in a stated order on the ceramics substrate 410. At a part where the depression 411 is formed, the ceramics layer 415 as a top layer is removed, and the wiring layer 414 is patterned into two parts, a cathode electrode side and an anode electrode side. Further, an Au coating is applied to a surface of a part (pad) where the wiring layer 414 is exposed because the ceramics layer 415 is removed by the depression 411. Although not shown in the drawing, a lower surface of the ceramics substrate 410 is applied with an Au coating in order to improve the heat dispersion property.

It is possible to use a layer made of $Al_2O_3$, BN, MgO, ZnO, or SiC for the ceramics substrate 410, instead of the AlN layer 412.

The LED chip 3 is disposed on the bottom surface of the depression 411 of the ceramics substrate 410, and Au layers 480 are inserted between the Ni/Al/Pt/Au layer 380 and the wiring layer 414 of the ceramics substrate 410. The Au layers are the Au bumps that are placed on the wiring layer 414 when the chip is mounted, as explained already. As shown in FIG. 13B, the LED chip 3 is connected onto a cathode pad 414a, which is a larger one of two pads (the cathode pad 414a and anode pad 414b) that are extending from facing sides of the inside wall of the depression 411. The cathode electrode 350 and anode electrode 360 of the LED chip 3 are connected to the cathode pad 414a and anode pad 414b via bonding wires 481 and 482, respectively.

In the present embodiment, the LED chip 3 and the pads 414a and 414b on the ceramics substrate 410 are connected by wire bonding. However, it is also possible, instead of connecting electrically by wire bonding, that the LED chip 3 and the pads are connected using bumps or by soldering, by a metal piece disposed in a penetrating hole in the LED chip 3 so as to dispose an electrode on a back surface of the LED chip 3.

Structures of the reflective mirror 450, the resin layer 460, and the lens layer 470 are the same as in the LED chip 1, and therefore not explained in detail.

Although not shown in the drawing, the LED module according to the present embodiment has substantially the same structure as the LED module in FIG. 5, other than the structure of and connection to the LED chip 3. A lighting apparatus having the LED module may be the same structure as shown in FIG. 8, or may have a different structure.

The lighting apparatus having the LED chip 3 according to the present embodiment irradiates white light having a color temperature of 4600 K and an average CRI of 90 by supplying a DC electricity of 150 mA to the LED module. A total luminous flux of this lighting apparatus is 1000 lm, and on-axis luminous intensity is 2000 cd. A spectral distribution of the white light irradiated by the lighting apparatus according to the present embodiment is illustrated in FIG. 14.

Figure 14:
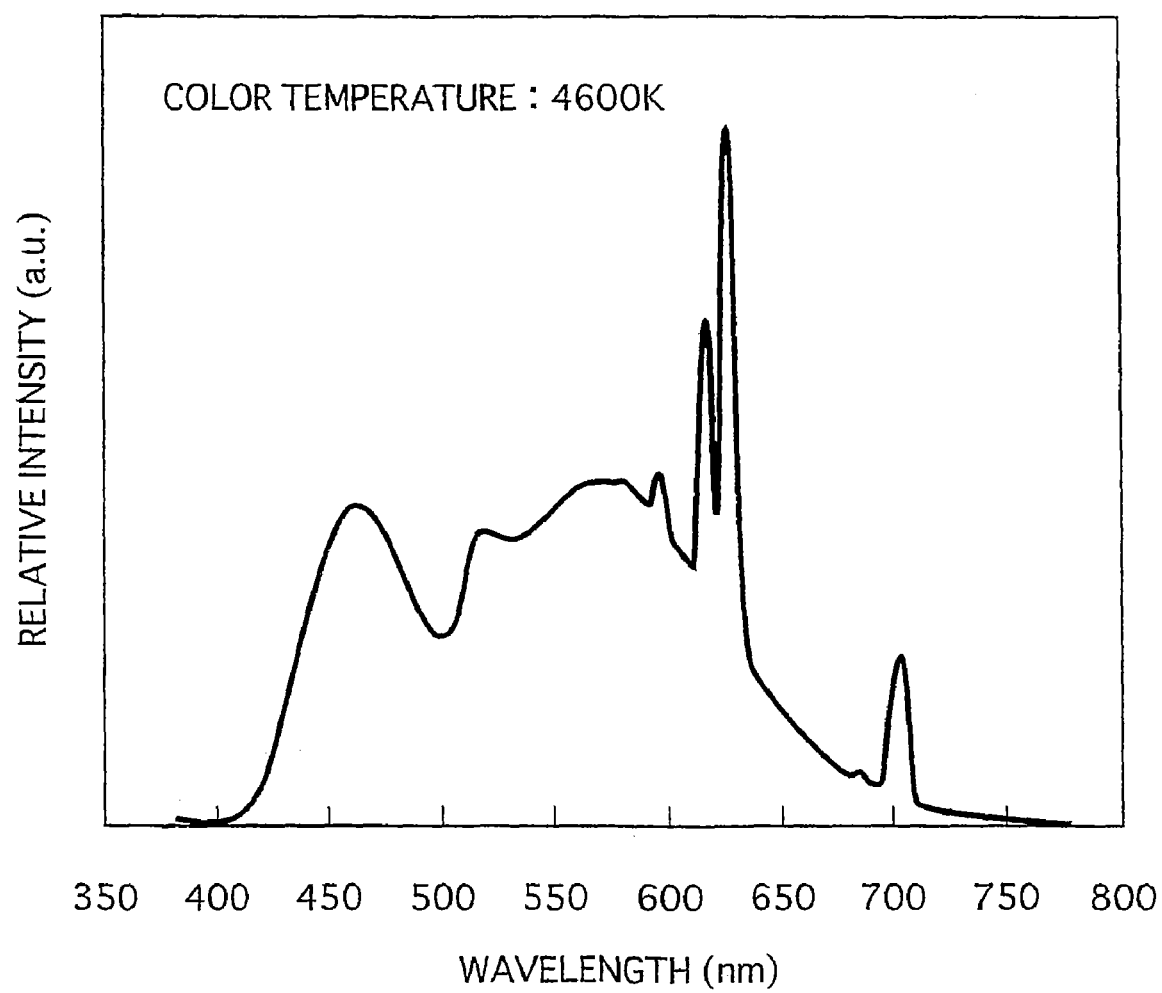
FIG. 14 shows an emission spectrum of a lighting apparatus having the LED chip 3.

As shown in FIG. 14, a relative intensity of an emission spectrum shows a sharp peak in vicinity of wavelengths 620 nm, and is relatively high in vicinity of wavelengths between 450 nm and 620 nm.

[Advantages of LED Chip 3, LED Module Using LED Chip 3, and Lighting Apparatus Using LED Chip 3]

As described above, the LED chip 3 according to the present embodiment is such that the depressions 326a are on a side of the p-electrode 326 which the near-ultraviolet light from the $In_{0.03}Ga_{0.97}N/Al_{0.05}Ga_{0.95}N\times 5$ luminous layer 323 passes through, and the membrane 370 is formed so as to cover the depressions 326a. When the LED chip 3 is mounted to the ceramics substrate 410, a vacuum collet sticks to the surface of the membrane 370, then the ultrasonic waves are applied after the LED chip 3 is pressed to the ceramics substrate 410. By forming the membrane 370, it is possible to mount the LED chip 3 without fail, because the vacuum collet firmly sticks to the LED chip 3, and the ultrasonic energy is not lost in the depressions 326a of the p-electrode 326. Further, because the loss of the ultrasonic energy in the depressions 326a is small and the surface of the depressions 326a is protected by the membrane 370, the depressions 326a are not destroyed by application of the ultrasonic waves when the chip is mounted. Such advantages are the same as the case of the first embodiment.

Because of the above advantages that the LED chip 3 has, it is possible that the LED module and the lighting apparatus having the LED chip 3 obtains, as in the case of the first embodiment, high light extraction efficiency and excellent heat dispersion property because the LED chip 3 is firmly attached when mounting. Thus, the LED module and the lighting apparatus having the LED chip 3 have such advantages that high light-emission efficiency and longevity.

Further, as in the LED chip 3 according to the present embodiment, when the p-electrode 326 and n-electrode 327 are disposed on one side, it is necessary, in general, to remove the luminous layer at the part where the n-electrode 327 is disposed, and therefore it is unavoidable that a luminous area becomes smaller. However, in the LED chip 3 according to the present embodiment, the light emitting elements are connected using the bridge wiring 380 in the LED chip 3, and it is possible to make the n-electrode 327 smaller in comparison with a case in which the light emitting elements are connected using bonding wires or bumps (For example, the n-electrode 327 can be 10 μm square, when it is 100 μm square when using bonding wires or bumps). Thus, by using the LED chip 3, the luminous area becomes wider, because it is possible to make an area of the p-electrode 326 under which the luminous layer is formed wider according to an area that the n-electrode 327 is made smaller.

For example, when a size of each light emitting element of the LED chip is 285 μm×400 μm, and an overlapping margin for attachment is 25 μm wide from an edge, an effective area becomes 82250 μm². Further, the luminous area per light emitting element of the LED chip 3, in which the area of the n-electrode accounts for 10×10 μm², according to the present embodiment becomes 82250−10×10=82150 μm². Calculating in the same way, a luminous area per light emitting element of a conventional LED chip, in which the area of the n-electrode accounts for 100×100 μm², becomes 72250 μm². In comparison, it is clear that the luminous area of the LED chip 3 according to the present embodiment is 1.13 times as large as that of the conventional LED chip.

Moreover, by making the luminous area wider, the current density may be reduced when the same current is supplied as the case in which the luminous area is smaller, and thus it is possible either to suppress the heat, or to increase quantity of light by supplying more current till the level of current density becomes the same as the case of the smaller luminous area.

As described above, the LED chip 3 according to the present embodiment has an advantage that, when the light emitting elements are connected using bridge wiring on the chip, it is possible to increase the luminous area even when the total chip area is the same, in comparison with the case in which the LED chip made of one light emitting element is connected by wire bonding or bumps.

Although the non-doped 4H—SiC substrate 310 is used as a substrate in the LED chip 3 according to the present embodiment, it is also possible to use a substrate of an n-SiC substrate on which a layer having a high resistance such as an AlGaN layer is formed. In this case, it is necessary that a separating groove does not completely remove the layer having high resistance.

Moreover, if the cathode electrode is connected to the n-SiC substrate in the LED chip 3, it is not necessary to use a bonding wire between the cathode pad and the cathode electrode.

As explained above, when the n-SiC substrate is used in place of the non-doped 4H-SiC substrate, it is possible to disperse the generated heat to the mounting substrate even when the luminous layer comes upper side, because the n-SiC substrate has as high heat conductance as metal.

It is also possible to use sapphire, AlN, and Si for the substrate, even though heat conductance of those material is not as good.

Third Embodiment

Next, a structure of an LED display apparatus 6 according to a third embodiment of the present invention is explained with reference to FIG. 15.

Figure 15A:
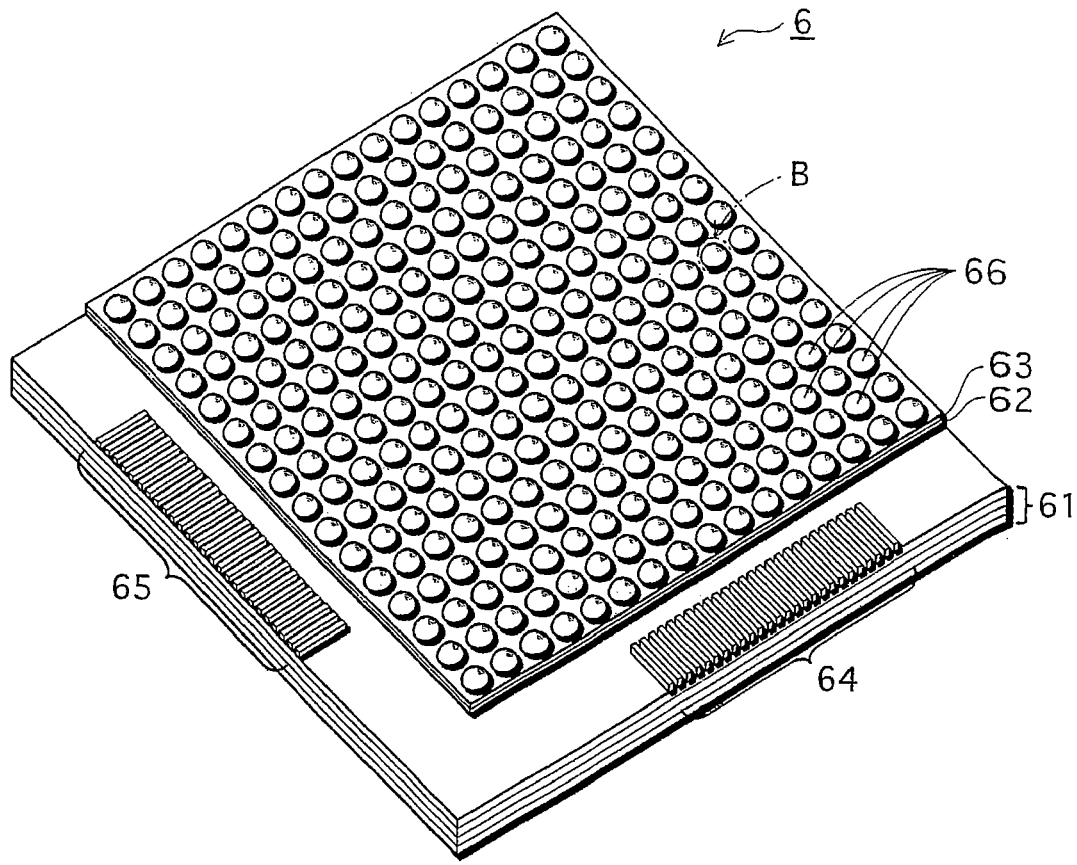
FIG. 15A is a perspective view of an LED display apparatus according to a third embodiment of the present invention.

As shown in FIG. 15A, the LED display apparatus 6 according to the present embodiment is such that a reflective mirror 62 and a lens 63 are layered, in a stated order, in an area on a main surface of a composite substrate 61, and 256 light emitting units 66 are formed in 16×16 in this area. Connecting terminals 64 and 65 that connect between the LED display apparatus 6 and a driving circuit to drive the LED display apparatus 6 are formed in the other areas on the main surface of a composite substrate 61. The connecting terminals 64 and 65, respectively, are connected to the LED chip 67 that constitutes each of the light emitting units 66 via wiring layers 615 and 616 formed as a part of the composite substrate 61 (See FIG. 15B).

Figure 15B:
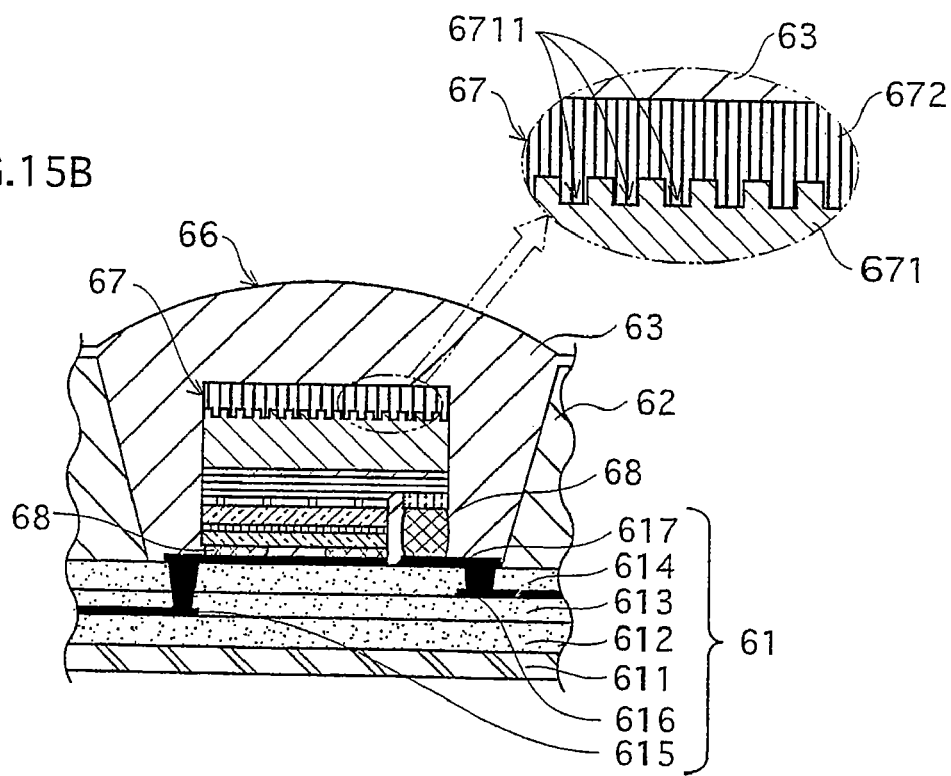
FIG. 15B is a sectional view to illustrate a part indicated by B in FIG. 15A.

As shown in FIG. 15B, the light emitting units 66 of the LED display apparatus 6 has such a structure that the LED chip 67 is attached to a conductive land 617 that is disposed on the main surface of the composite substrate 61, i.e. the LED chip 67 is mounted to the composite substrate 61 by flip-chip bonding. Then, the reflective mirror 62 is disposed so as to surround the LED chip 67, and the lens 63 is formed so as to cover the LED chip 67 and the reflective mirror 62.

The composite substrate 61 is formed by a metal layer 611 and three insulating layers 612-614, and wiring layers 615 and 616 are formed, respectively, between the insulating layer 613 and 614 and between the insulating layers 612 and 613. The conductive land 617 and each of the wiring layers 615 and 616 are connected by a via hole.

As shown in FIG. 15B, the LED chip 67 has the same structure as the light emitting element 20 in the LED chip 1 shown in FIG. 2. Further, as shown in an enlarged part of FIG. 15B, minute depressions 6711 having a square shaped opening are formed on an entire surface of a non-doped GaN substrate 671 on a side that the light is irradiated (upper side in the drawing). The depressions 6711 are formed at an interval of 1 μm, for example.

A membrane 672 is formed on the non-doped GaN substrate 671 so as to fill the depressions 6711. As in the first embodiment, the membrane 672 is mainly made of a polyimide resin having transmissivity, and contains a yellow phosphor material such as $(Sr, Ba)_2SiO_4:Eu^{2+}$, and ultrafine particles such as $SiO_2$ in a dispersed state. The membrane 672 is formed so as to be 80 μm thick at the thinnest part (parts that do not have the depression 6711), and so that a surface is substantially flat. A structure of the membrane 672 is the same as in a case of the first embodiment.

With the LED display apparatus 6 according to the third embodiment, as in the first embodiment, it is possible to protect the depression 6711 and suppress displacement of the LED chip 67 when the LED chip 67 is mounted to the composite substrate 61 by flip-chip bonding. Further, by having the membrane 672, the ultrasonic energy applied does not become weakened between the vacuum collet and LED chip when the vacuum collet applies the ultrasonic waves.

With the LED display apparatus 6 having the above structure, the depressions 6711 on the non-doped GaN substrate 671 of the LED chip 67 are protected, and thus it is possible to obtain high light extraction efficiency, as well as high light emitting efficiency due to a firm attachment in mounting.

The LED display apparatus 6 according to the present embodiment illustrates an example of the present invention, and the present invention is not restricted by this embodiment. For example, it is possible to use TFT substrate instead of the composite substrate 61.

Fourth Embodiment

A structure of a fourth embodiment is explained below, with reference to FIG. 16. In the present embodiment, a Vertical Cavity Surface Emitting Laser (hereinafter referred to as VCSEL) device is taken as an example.

Figure 16A:
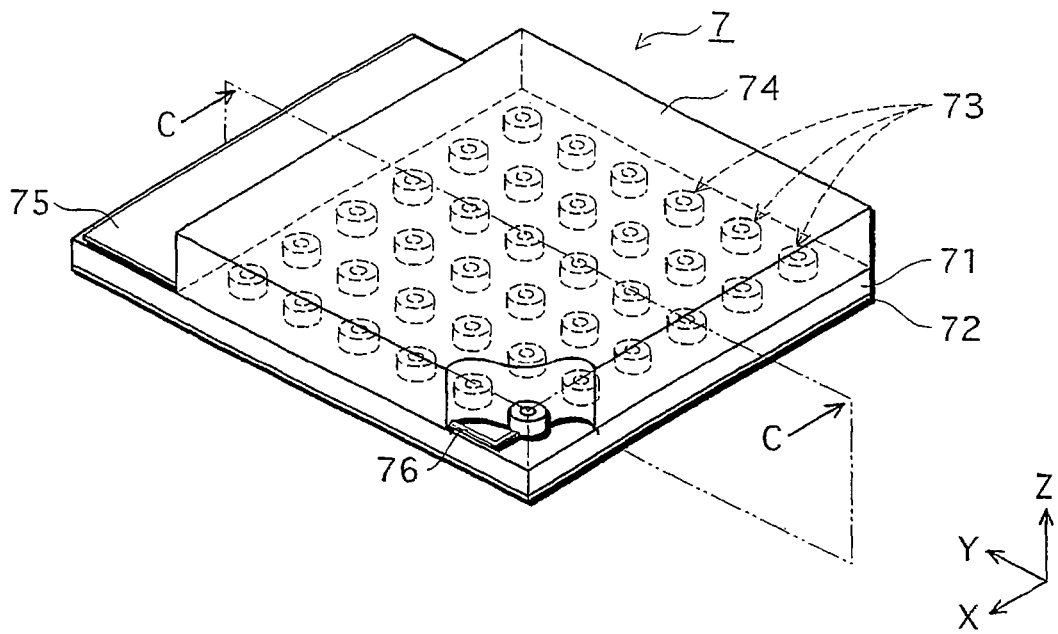
FIG. 16A is a perspective view of a Vertical Cavity Surface Emitting Laser (VCSEL) device 7 according to a fourth embodiment according to the present invention.

As shown in FIG. 16A, a VCSEL device 7 according to the present embodiment is such that a cathode electrode 72 is disposed on one of main surfaces of a SiC substrate 71 (lower surface in FIG. 16A), a phosphor layer 74 is formed on a part of the other side of main surfaces (upper surface in FIG. 16A), and an anode electrode 75 is disposed on the rest of the same side of main surfaces. A total number of 36 VCSEL cells 73 are formed in the area of the SiC substrate 71 that is covered by the phosphor layer 74. As shown in the drawing by a partial cutout part, an anode electrode 738 (See FIG. 16B) of each of the VCSEL cells 73 and the anode electrode 75 disposed on the main surface of the SiC substrate 71 are connected by an Al bridge wiring 76.

Figure 16B:
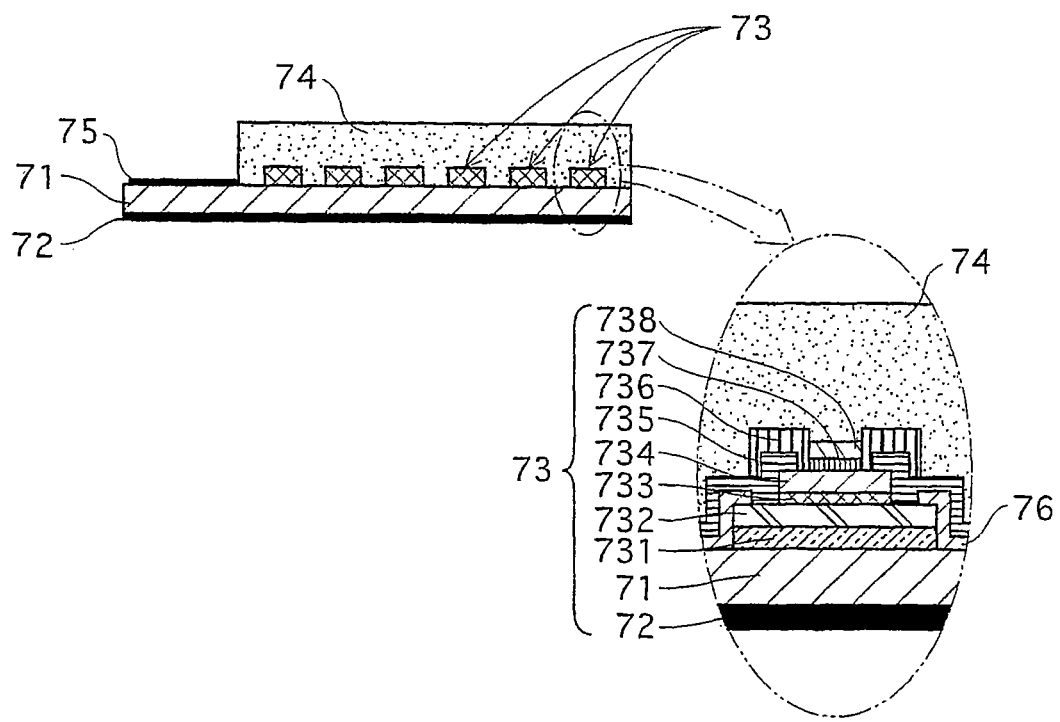
FIG. 16B is a partial sectional view of the VCSEL device 7.

As shown by a sectional view of FIG. 16B taken at a plane indicated by C-C, there are 6 VCSEL cells 73 at the section of the VCSEL device 7. As shown in an enlarged view of FIG. 16B, the VCSEL cell 73 is formed the SiC substrate 71, the cathode electrode 72 that is formed on one of the main surfaces of the SiC substrate 71, and layers that are layered on the other side of the main surfaces on which the phosphor layer 74 is formed. The layers that are layered on the other side of the main surfaces are formed on the SiC substrate 71 such that a semiconductor DBR layer 731, an n-clad layer 732, an active layer having a multiplex quantum well structure (hereinafter referred to as MQW layer) 733, and a p-clad layer 734 are layered in a stated order, and an SiN passivation layer 735 and an anode electrode 736 are formed so as to enclose a layered part of the above layers. Further, an ITO layer 737 and a dielectric DBR layer are layered in a stated order on a part of a surface of the p-clad layer 734 that is enclosed by the anode electrode 736.

As explained above, each of the VCSEL cells 73 of the VCSEL device 7 is structured by the SiC substrate 71, the cathode electrode 72, and the above-described more than one components 731-738. Further, a characteristics of the above VCSEL device 7 according to the present embodiment is in that the phosphor layer 74 covers an entire part where the VCSEL cells 73 are formed. Specifically, as in the first to third embodiments, covering an entire VCSEL cells 73 by the phosphor layer 74 protects the anode electrode 736 and such of each of the VCSEL cells 73 from being damaged when mounting the VCSEL device 7, and also ensures an accurate mounting. In addition, it is possible to obtain the same effect as in the first and second embodiments.

Next, a method of manufacturing the VCSEL device 7 according to the present embodiment is explained with reference to FIGS. 17 and 18. Both FIGS. 17 and 18 illustrate the same one of the VCSEL cells 73, for convenience.

Figure 17A:
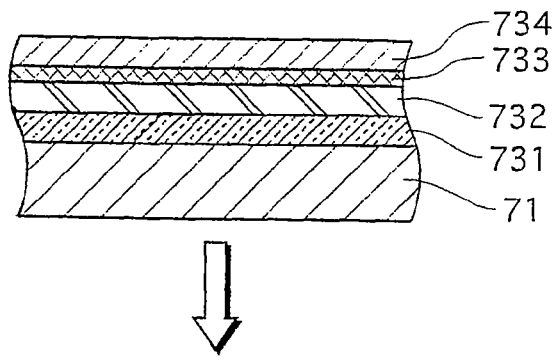
FIG. 17 illustrates manufacturing steps of the VCSEL device 7.

As shown in FIG. 17A, the semiconductor DBR layer 731, the n-clad layer 732, the MQW layer 733, and the p-clad layer 734 are layered, in a stated order, on one of the main surfaces of the SiC substrate 71.

Figure 17B:
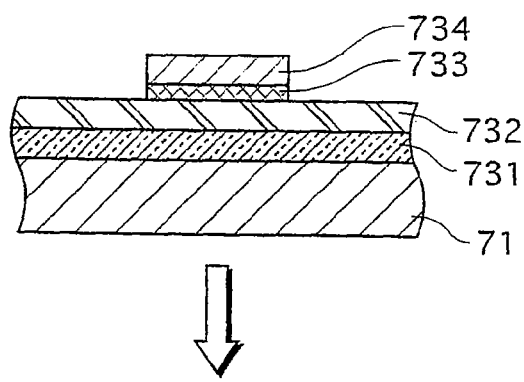

As shown in FIG. 17B, a mask (not shown in the drawing) is formed at an area of a surface of the p-clad layer 734, specifically, an area where the VCSEL cells 73 are formed, and etching is performed with the n-clad layer 732 as a stopper layer. By this etching, the MQW layer 733 and p-clad layer 734 remain in projections on an area on the surface of the n-clad layer 732.

Figure 17C:
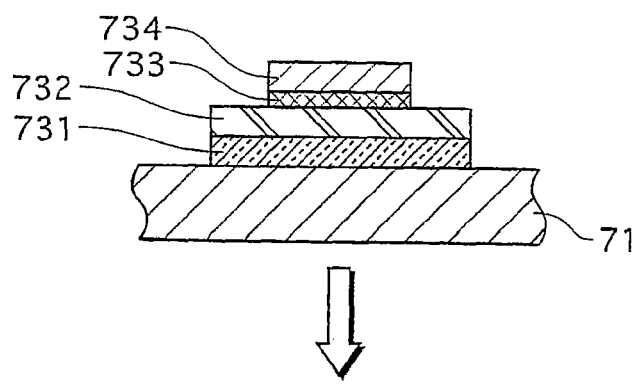
Figure 17D:
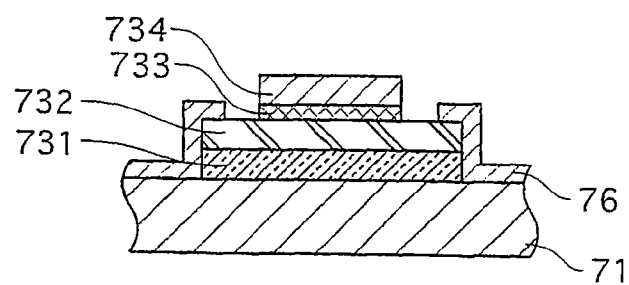

As shown in FIG. 17C, the semiconductor DBR layer 731 and n-clad layer 732 are etched so as to be slightly larger in section than the MQW layer 732 and p-clad layer 734. After this, as shown in FIG. 17D, the Al bridge wiring 76 is formed so as to reach the surface of the SiC substrate 71 and a part of the surface of the n-clad layer 734.

Figure 18E:
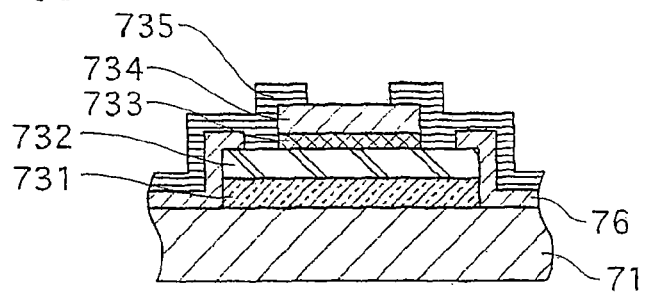
FIG. 18 also illustrates manufacturing steps of the VCSEL device 7.

As shown in FIG. 18E, the SiN passivation layer 735 is formed so as to cover a surface that the Al bridge wiring 76 and n-clad layer 732 remain and the area of the surface the p-clad layer 734.

Figure 18F:
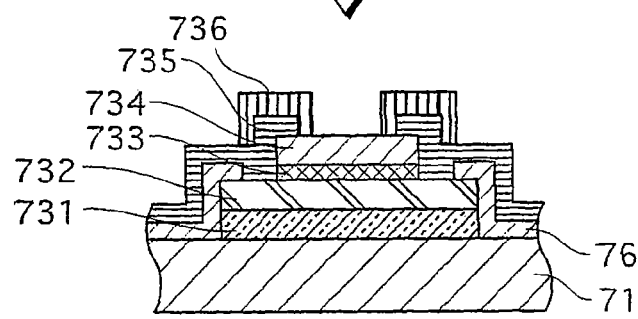

Next, as shown in FIG. 18F, the anode electrode 736 is formed on an area of a surface of the SiN passivation layer 735 and the area of the p-clad layer 734.

Figure 18G:
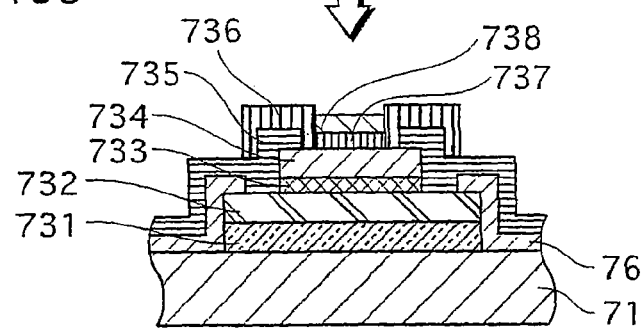

As shown in FIG. 18G, an ITO layer 737 and a dielectric DBR layer 738 are layered in a stated order at the area of the surface of the p-clad layer 734 surrounded by the anode electrode 736. In addition, as shown in FIG. 18H, the cathode electrode 72 is formed on an entire surface of the other main surface of the SiC substrate 71.

Figure 18H:
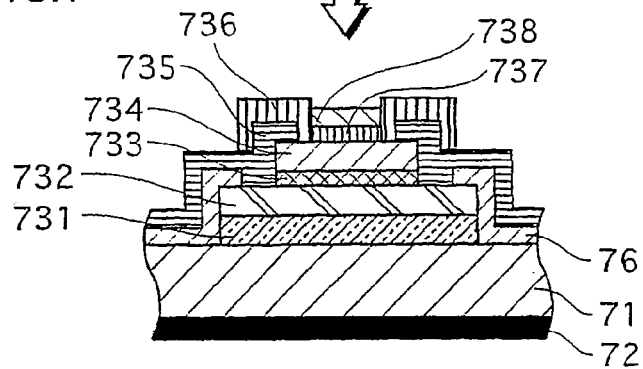

Although not shown in the drawing, after a step shown in FIG. 18H, the phosphor layer 74 is formed, where necessary, on the surface of the SiC substrate 71 where the above elements 731-738 are formed. Finally, the VCSEL cells 73 of the VCSEL device 7 is completed after the SiC substrate 71 is cut into units as shown in FIG. 16.

As described above, in manufacturing the VCSEL device 7, the phosphor layer 74 is formed so as to form an entire area where the VCSEL cells 73 to be formed. The phosphor layer 74 is formed so as that its surface becomes substantially flat. Therefore, an advantageous effect may be obtained because it is possible to mount the VCSEL device 7 to the substrate using the surface of the phosphor layer 74.

Although the present embodiment is explained by taking the VCSEL device as an example, the same effect may be obtained when applied to a Resonant Cavity Light Emitting Diode (RC-LED) that has substantially the same structure as the VCSEL device.

[Other Matters]

The first to fourth embodiments are examples to explain the characteristics of the structures and effects of the present invention, and the present invention is not restricted by these embodiments. For example, in the first and second embodiments, the white light irradiated from each of the light emitting units 120 is generated by the light from the luminous layer mixing with light generated by the luminous substance being excited by the light from the luminous layer. However, it is also possible that either the white light or mono color light is generated using mono-color LED modules, or mixing mono-color LED lights.

Moreover, although the membranes 70 and 370 in the LED chips 1 and 3 contain the phosphor material and such, the phosphor material and such do not necessarily have to be contained. Basically, these membranes are formed in order to allow the vacuum collet to stick to the LED chips 1 and 3 more firmly when the LED chips are mounted, as well as to reduce the loss in the ultrasonic energy. Thus, whether or not the phosphor material is contained is not an essential part of the present invention.

In addition, the examples of the material to form the membrane 70 listed in the first embodiment are organic resins such as polyimide, epoxy, and silicone. However, it is also possible to use glass by the sol-gel method or low-melting glass for the membrane 70. Specific examples of the glass material include (1) a glass material using metal alkoxide (such as tetramethoxysilane and tetraethoxysilane) as starting material, (2) a glass material made from polymer ceramic precursor such as perhydropolysilazane, and (3) a glass material made from such as phosphorus oxide and boronic oxide.

With any of the above listed glass materials, it is possible to form a glass layer (membrane) whose upper surface is substantially flat and filling the depressions, by applying the glass material on the depressions using such as potting and spin-coating, drying the glass material, and baking the glass material at a temperature of several hundred degrees centigrade.

Further, with the above semiconductor light emitting devices explained in the first to fourth embodiments, the advantages that the vacuum collet firmly sticks to the LED chip may be obtained even without applying the ultrasonic waves when the LED chip is mounted.

It is also possible to modify the structures of the display device 6 and VCSEL device 7 explained in the third and fourth embodiments, respectively, within a scope in which the effects of the present invention may be obtained.

Figure 19:
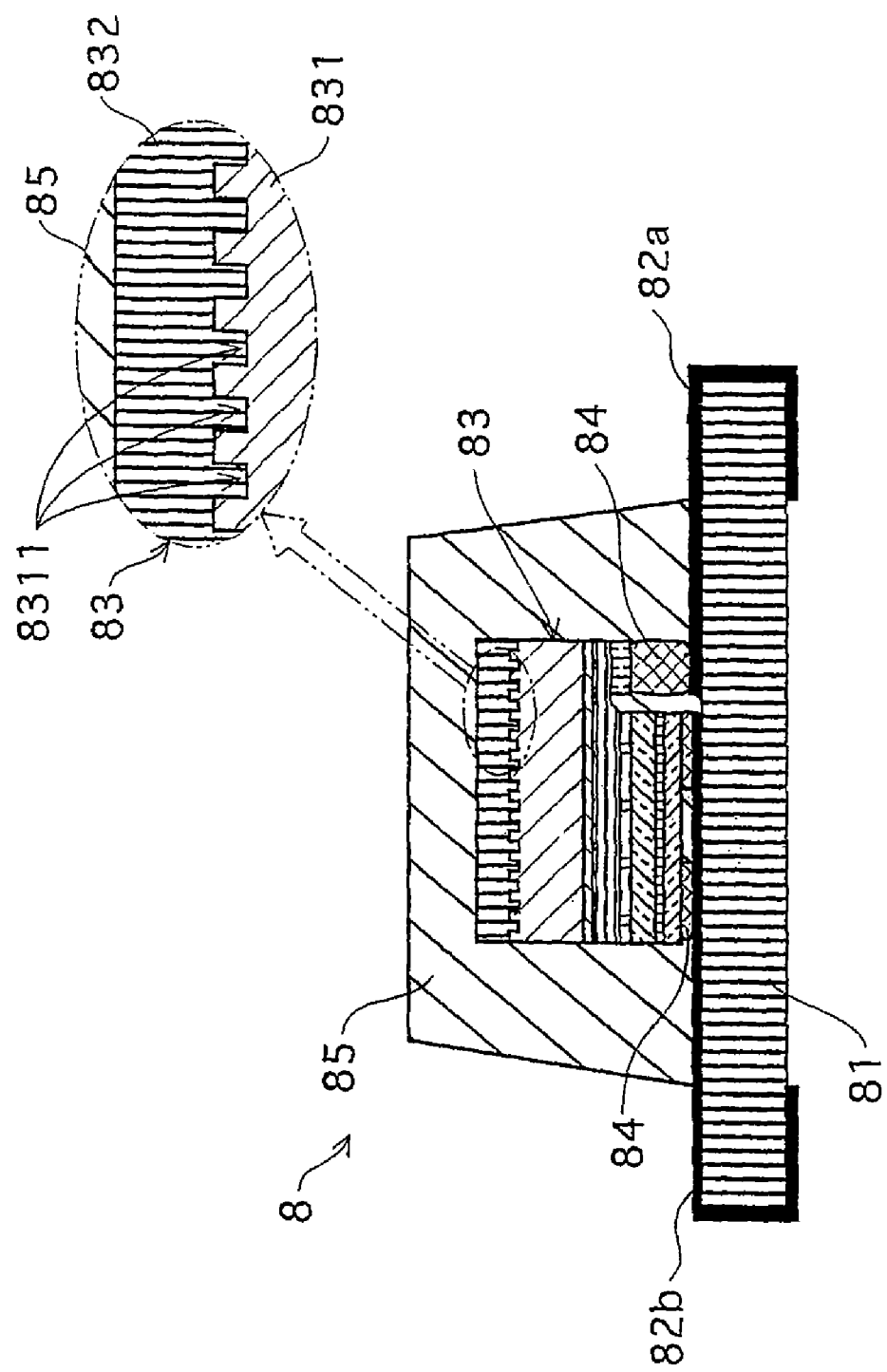
FIG. 19 is a sectional view illustrating a Surface Mount Device as a modified example.
Figure 20:
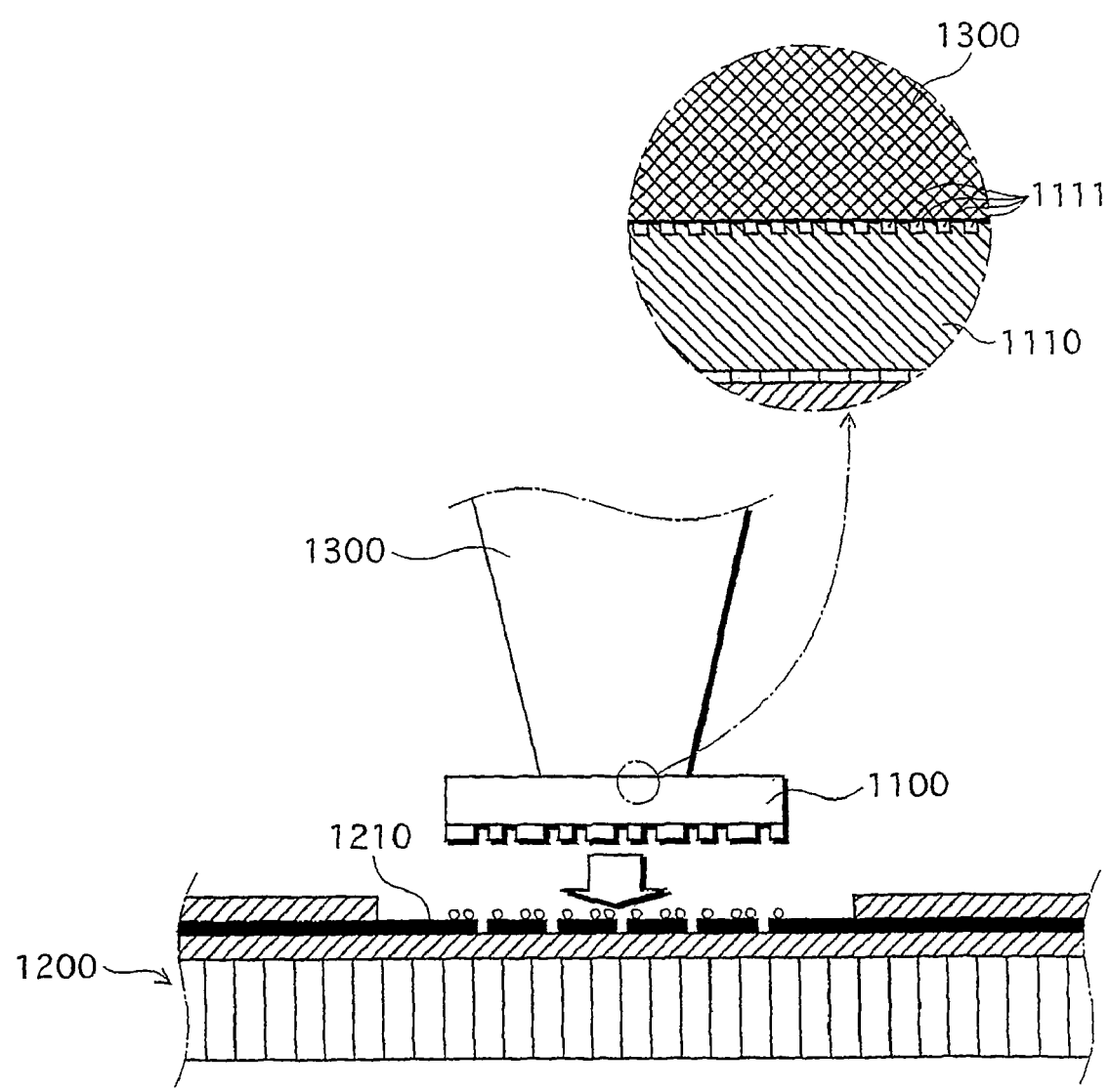
FIG. 20 is a schematic view showing steps in mounting a conventional LED chip 1100 to a mounting substrate 1210.

Moreover, the present invention may be applied to a Surface Mount Device (SMD) illustrated in FIG. 19. As shown in FIG. 19, an SMD 8 to which the present invention is applied is structured so that a pair of external electrodes 82a and 82b are disposed on a mounting substrate 81, and a LED chip 82 is mounted to the electrodes 82a and 82b by flip-chip bonding with bumps therebetween, and the LED chip 82 and electrodes 82a and 82b over the mounting substrate 81 are covered by a resin package 85.

As shown in an enlarged part in FIG. 19, the LED chip 82 of the SMD 8, like the LED chip 67 in the second embodiment described above, has a surface with depressions 8311, and a membrane 8322 covers the LED chip 67 so as to fill the depressions. With the SDM 8 having the above structure, it is possible to obtain the same effects as the above first to fourth embodiments, because damages to the depressions in mounting the LED chip 82 to the mounting substrate 81 may be reduced.

INDUSTRIAL APPLICABILITY

The present invention is effective to realize a high power semiconductor light emitting device having high light output, and a lighting apparatus and a display device using such a semiconductor light emitting device.

The invention claimed is:

1. A light-emitting module to be attached to a luminaire, comprising:
a substrate that is substantially round and plate-like, having a hole penetrating through to a reverse side, that is positioned, when attaching the substrate to the luminaire, so that a first main face of the substrate is in contact with the luminaire; and
a semiconductor light-emitting element that is mounted on a second main surface of the substrate, wherein
a pin is provided to extend from the surface of the luminaire that is in contact with the substrate, in a thickness direction of the substrate, and
when attaching to the luminaire, the hole in the substrate functions as a guide for the pin, and receives an insertion of the pin.

2. The light-emitting module of claim 1, wherein
a notch is formed on a portion of an outer edge of the substrate,
on the luminaire, a depression that accommodates the substrate is formed, and a protrusion corresponding to the notch is provided to extend from a side wall of the depression, and
when attaching to the luminaire, the notch in the substrate functions as a guide for the pin, and receives an insertion of the pin.

3. The light-emitting module of claim 2, wherein
a module terminal is formed on the second main face of the substrate so as to be in contact with the semiconductor light-emitting element on the outer edge portion, and
a feed terminal extends toward a radial inner side, and is connected to the module terminal.

4. The light-emitting module of claim 1, wherein
the substrate includes a metal layer exposed on the first main surface.

5. A luminaire into which a light-emitting module is attached, comprising:
a luminaire body including a depression that includes a round opening, and including a pin provided to extend from a bottom face of the depression; and
a feed terminal that extends from a side wall of the depression toward a radial inner side of the depression, wherein
the light-emitting module includes a substrate that is substantially round and plate-like,
when the light-emitting module is being attached, a first main surface of the substrate is in contact with the bottom face of the depression, and a hole is provided in the substrate that penetrates through to a reverse side, and when the light-emitting module is being attached, the hole in the substrate functions as a guide for the pin, and the pin is inserted in the hole.

6. The luminaire of claim 5, wherein on the side wall of the depression, a protrusion is provided to extend toward the radial inner side of the depression, a notch is formed on a portion of an outer edge of the substrate of the light-emitting module, and when the light-emitting module is being attached, the notch in the substrate functions as a guide for the protrusion, and the protrusion is inserted into the notch.

7. The luminaire of claim 5, wherein the feed terminal is cranked in the extending portion, and is connected to a module terminal formed in a second main face of the substrate in the light-emitting module.

* * * * *